United States Patent
Pajuvang et al.

(10) Patent No.: US 12,489,078 B2
(45) Date of Patent: Dec. 2, 2025

(54) SEMICONDUCTOR DEVICE AND METHOD OF DISPOSING ELECTRICAL COMPONENTS ABOVE AND BELOW SUBSTRATE

(71) Applicant: UTAC Headquarters Pte. Ltd., Singapore (SG)

(72) Inventors: Krit Pajuvang, Bangkok (TH); Siriwanna Ounkaew, Bangkok (TH)

(73) Assignee: UTAC Headquarters Pte. Ltd., Singapore (SG)

( * ) Notice: Subject to any disclaimer, the term of this patent is extended or adjusted under 35 U.S.C. 154(b) by 446 days.

(21) Appl. No.: 17/656,508

(22) Filed: Mar. 25, 2022

(65) Prior Publication Data

US 2022/0320033 A1    Oct. 6, 2022

Related U.S. Application Data

(60) Provisional application No. 63/168,147, filed on Mar. 30, 2021.

(51) Int. Cl.
*H01L 23/00* (2006.01)
*H01L 23/31* (2006.01)
(Continued)

(52) U.S. Cl.
CPC .......... *H01L 24/48* (2013.01); *H01L 23/3107* (2013.01); *H01L 23/49575* (2013.01); *H01L 23/49582* (2013.01); *H01L 24/85* (2013.01); *H01L 24/96* (2013.01); *H01L 24/97* (2013.01); *H01L 25/0657* (2013.01); *H01L 25/105* (2013.01); *H01L 25/50* (2013.01); *H01L 2224/48245* (2013.01)

(58) Field of Classification Search
CPC ............ H01L 24/48; H01L 2224/0651; H01L 2224/48245; H01L 23/3107–315; H01L 23/495–49596
USPC ......................................................... 257/666
See application file for complete search history.

(56) References Cited

U.S. PATENT DOCUMENTS

| | | | |
|---|---|---|---|
| 6,710,246 B1 * | 3/2004 | Mostafazadeh | H01L 23/3107 257/E25.023 |
| 10,564,046 B2 * | 2/2020 | Nakagawa | G01K 7/01 |

(Continued)

FOREIGN PATENT DOCUMENTS

CN           101335216 A      12/2008

*Primary Examiner* — Kevin Parendo
(74) *Attorney, Agent, or Firm* — Robert D. Atkins; PATENT LAW GROUP: Atkins and Associates, P.C.

(57) ABSTRACT

A semiconductor device has a substrate with a die mounting site and a plurality of leads. A first electrical component is disposed over a first surface of the die mounting site. A second electrical component is disposed over a second surface of the die mounting site opposite the first surface of the die mounting site. A first bond wire is coupled between the first electrical component and a first lead, and a second bond wire is coupled between the second electrical component and a second lead. A first encapsulant is deposited over the first electrical component, and a second encapsulant is deposited over the second electrical component with the leads exposed between the first encapsulant and second encapsulant. The leads are exposed from the first encapsulant and second encapsulant on a side of the semiconductor device.

20 Claims, 27 Drawing Sheets

(51) Int. Cl.
*H01L 23/495* (2006.01)
*H01L 25/00* (2006.01)
*H01L 25/065* (2023.01)
*H01L 25/10* (2006.01)

(56) References Cited

U.S. PATENT DOCUMENTS

| | | | |
|---|---|---|---|
| 2010/0308468 A1* | 12/2010 | Yoshikawa | H01L 23/49541 |
| | | | 257/E23.116 |
| 2018/0114744 A1* | 4/2018 | Brandl | H01L 23/49541 |
| 2020/0176271 A1* | 6/2020 | Nasu | H01L 23/49548 |

* cited by examiner

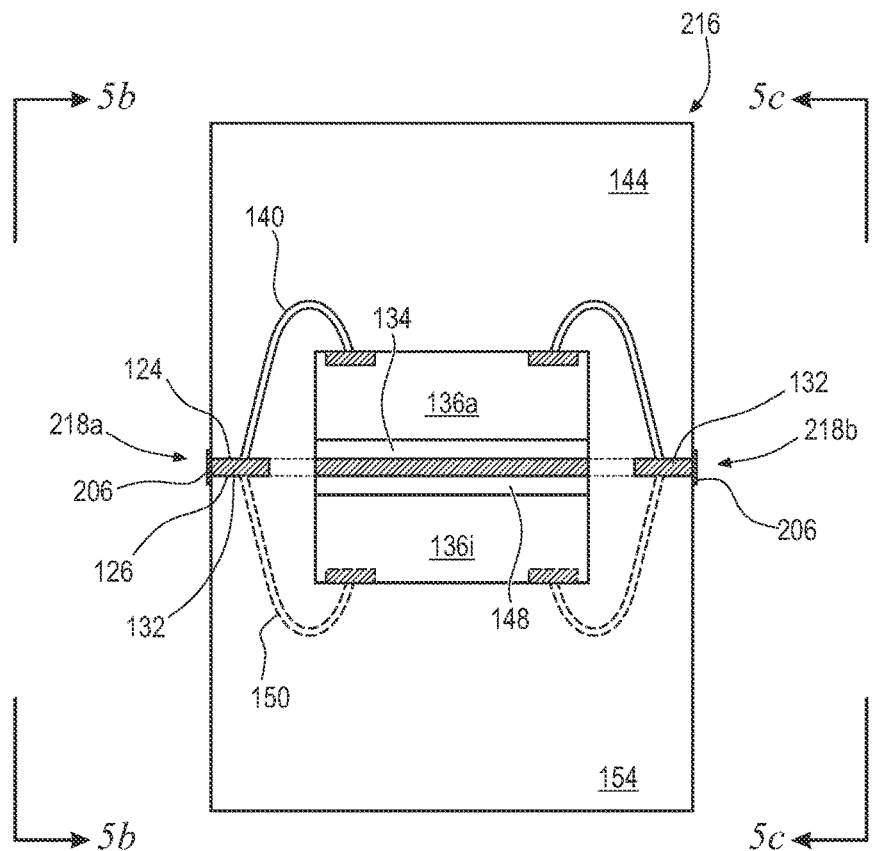
*FIG. 5a*
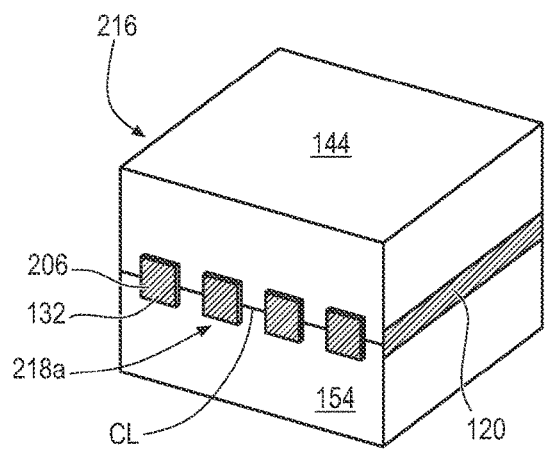 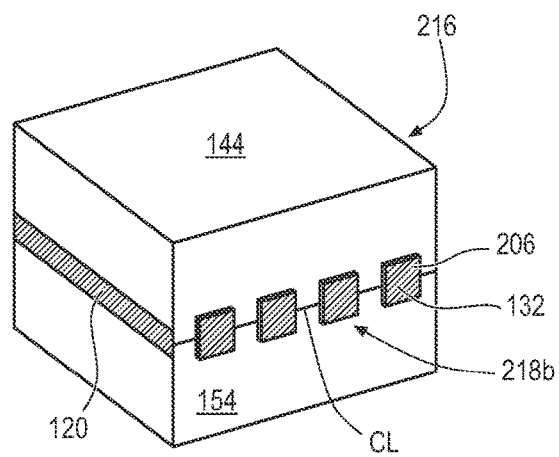
*FIG. 5b*  *FIG. 5c*

SEMICONDUCTOR DEVICE AND METHOD OF DISPOSING ELECTRICAL COMPONENTS ABOVE AND BELOW SUBSTRATE

CLAIM OF DOMESTIC PRIORITY

The present application claims the benefit of U.S. Provisional Application No. 63/168,147, filed Mar. 30, 2021, which application is incorporated herein by reference.

FIELD OF THE INVENTION

The present invention relates in general to semiconductor devices and, more particularly, to a semiconductor device and method of disposing electrical components above and below a substrate with exposed leads.

BACKGROUND OF THE INVENTION

Semiconductor devices are commonly found in modern electronic products. Semiconductor devices perform a wide range of functions, such as signal processing, high-speed calculations, sensors, transmitting and receiving electromagnetic signals, controlling electronic devices, photo-electric, and creating visual images for television displays. Semiconductor devices are found in the fields of communications, power conversion, networks, computers, entertainment, and consumer products. Semiconductor devices are also found in military applications, aviation, automotive, industrial controllers, and office equipment.

A semiconductor die can be mounted to a leadframe for electrical interconnect and encapsulated for structural support and environmental protection in a semiconductor package. The leads of the leadframe are exposed around a perimeter of a bottom surface of the semiconductor package. The semiconductor package is mounted to a printed circuit board (PCB) with the exposed leads making electrical connection to traces on the PCB. The semiconductor die mounted to the leadframe within the encapsulated semiconductor package consumes a portion of the available area of the PCB. PCB area allocations for various semiconductor die functionality should be minimized.

In addition, a first semiconductor die within a first package mounted to the PCB may have considerable lead length to a second semiconductor die in a second package on the PCB. The long lead length may result in propagation delays and lower operating efficiency.

BRIEF DESCRIPTION OF THE DRAWINGS

FIGS. 5a-5e illustrate the semiconductor package from FIG. 4c mounted to a PCB;

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The term "semiconductor die" as used herein refers to both the singular and plural form of the words, and accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1A:
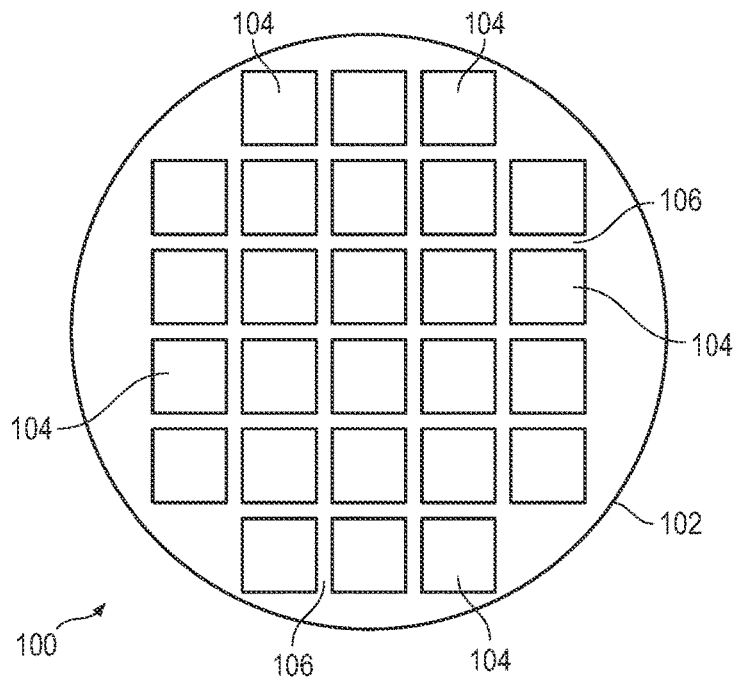
FIGS. 1a-1c illustrate a semiconductor wafer with a plurality of semiconductor die separated by a saw street.

FIG. 1a shows a semiconductor wafer 100 with a base substrate material 102, such as silicon, germanium, aluminum phosphide, aluminum arsenide, gallium arsenide, gallium nitride, indium phosphide, silicon carbide, or other bulk material for structural support. A plurality of semiconductor die or components 104 is formed on wafer 100 separated by a non-active, inter-die wafer area or saw street 106. Saw street 106 provides cutting areas to singulate semiconductor wafer 100 into individual semiconductor die 104. In one embodiment, semiconductor wafer 100 has a width or diameter of 100-450 millimeters (mm).

Figure 1B:
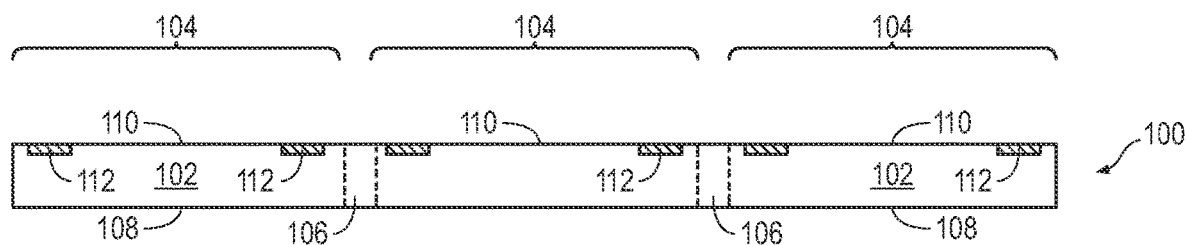

FIG. 1B shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within the die and electrically interconnected according to the electrical design and function of the die. For example, the circuit may include one or more transistors, diodes, sensors, and other circuit elements formed within active surface 110 to implement analog circuits or digital circuits, such as digital signal processor (DSP), application specific integrated circuits (ASIC), memory, or other signal processing circuit. Semiconductor die 104 may also contain IPDs, such as inductors, capacitors, and resistors, for RF signal processing.

An electrically conductive layer 112 is formed over active surface 110 using PVD, CVD, electrolytic plating, electroless plating process, or other suitable metal deposition process. Conductive layer 112 can be one or more layers of aluminum (Al), copper (Cu), tin (Sn), nickel (Ni), gold (Au), silver (Ag), platinum (Pt), or other suitable electrically conductive material. Conductive layer 112 operates as contact pads electrically connected to the circuits on active surface 110.

Figure 1C:
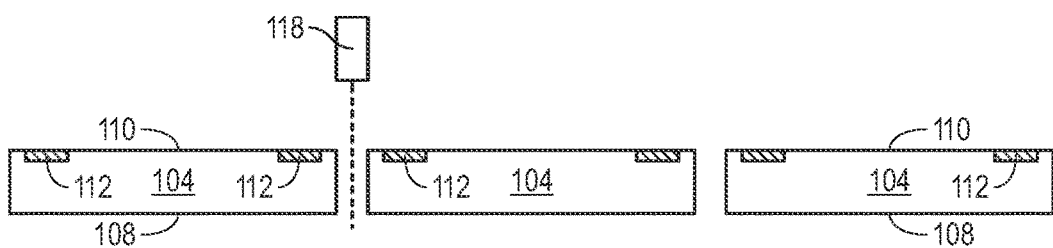

In FIG. 1c, semiconductor wafer 100 is singulated through saw street 106 using a saw blade or laser cutting tool 118 into individual semiconductor die 104. The individual semiconductor die 104 can be inspected and electrically tested for identification of known good die or unit (KGD/KGU) post singulation.

Figure 2A:
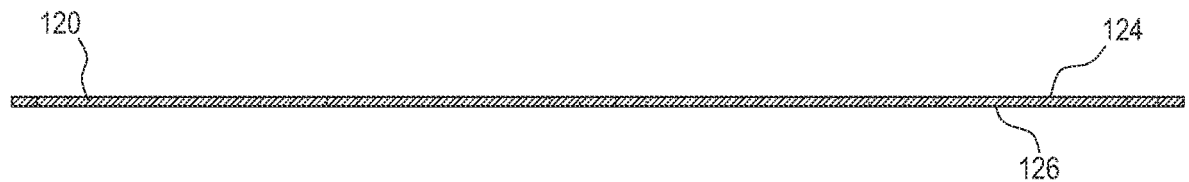
FIGS. 2a-2r illustrate a process of disposing electrical components above and below a substrate with exposed leads.
Figure 2B:
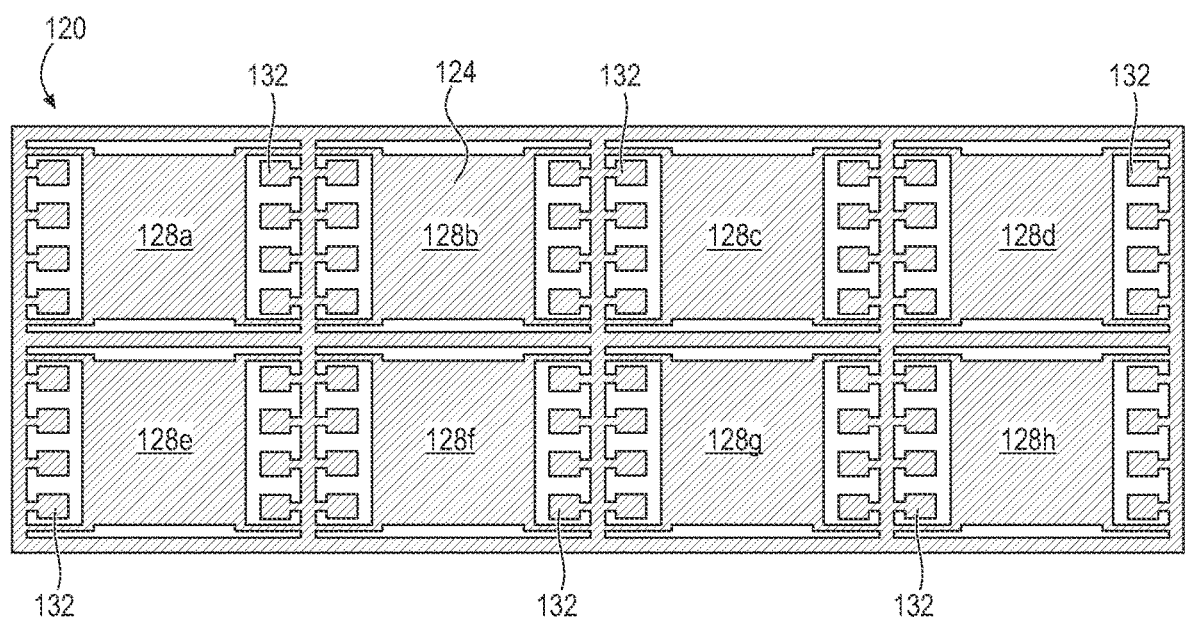
Figure 2C:
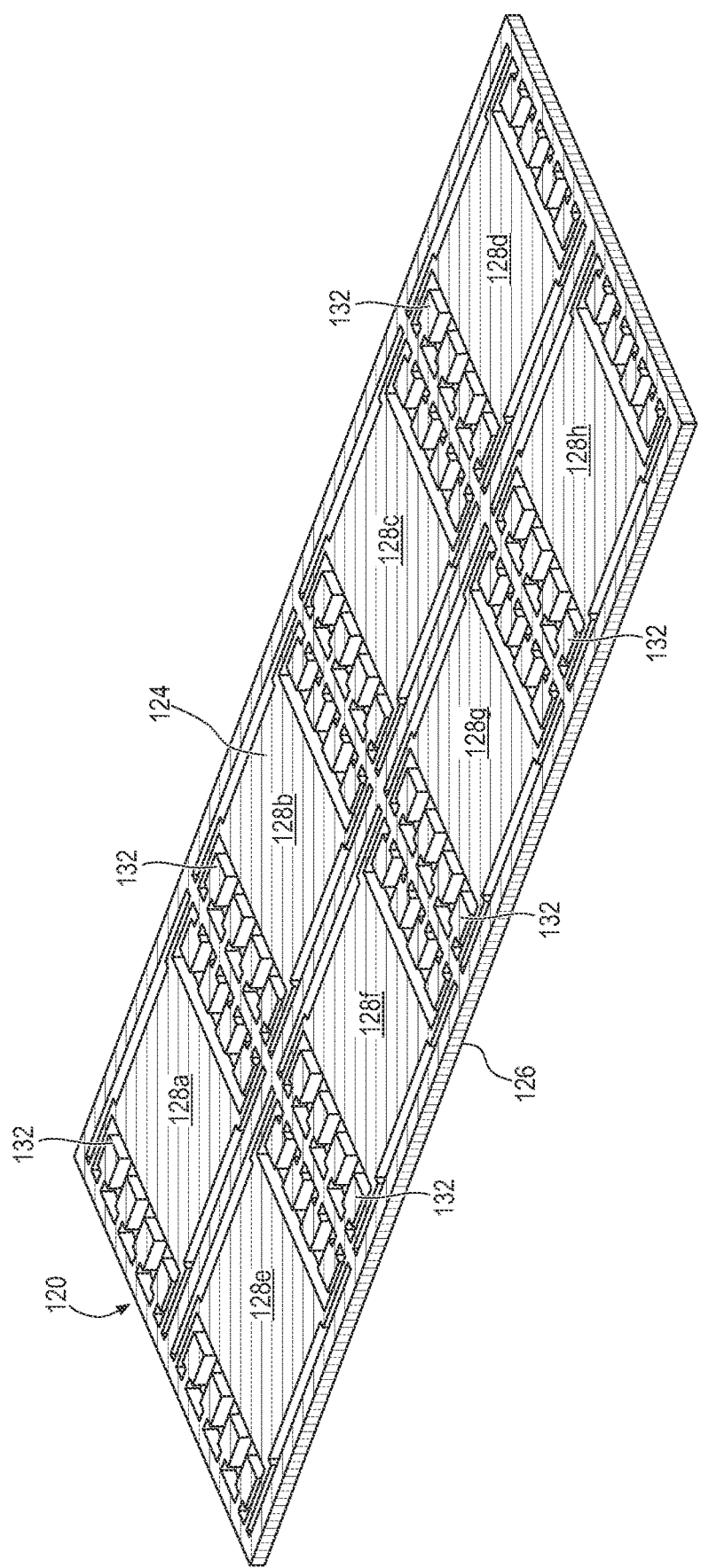
Figure 2D:
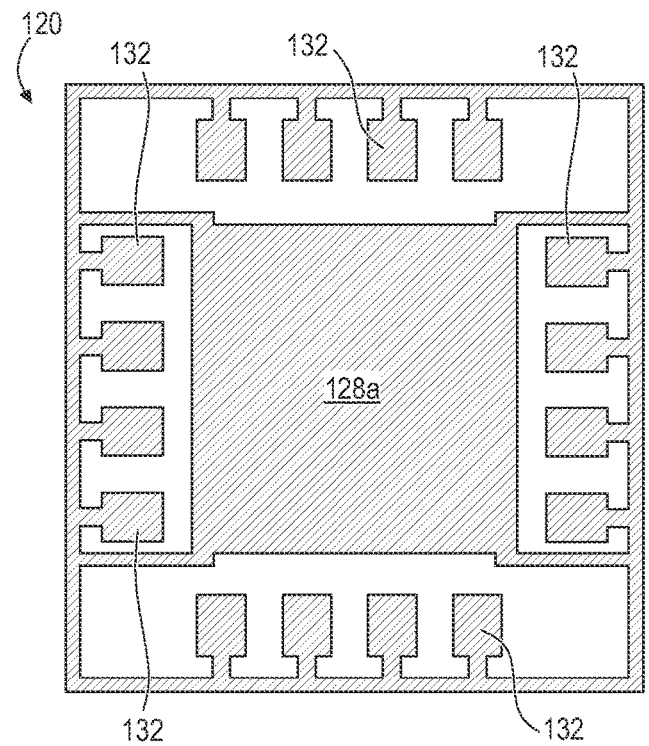
Figure 2E:
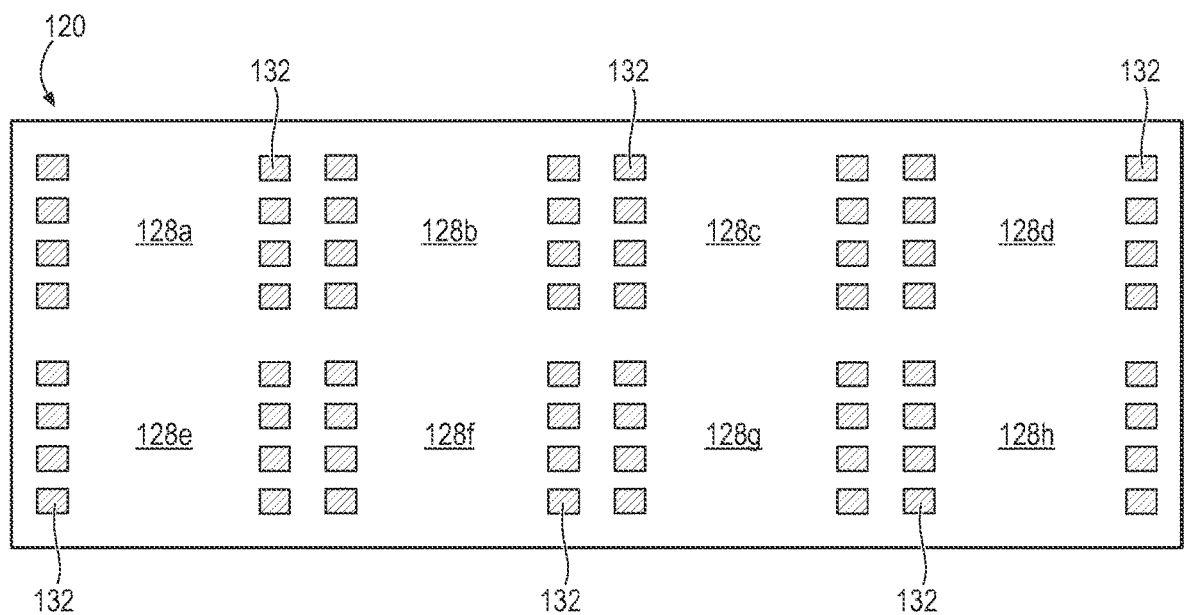
Figure 2F:
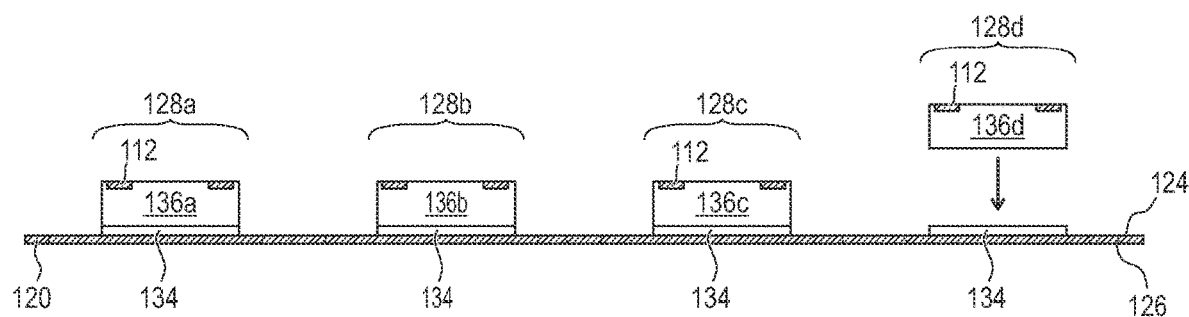
Figure 2G:
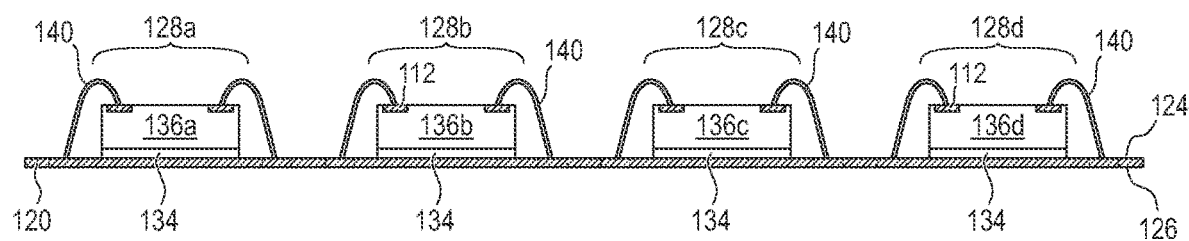
Figure 2H:
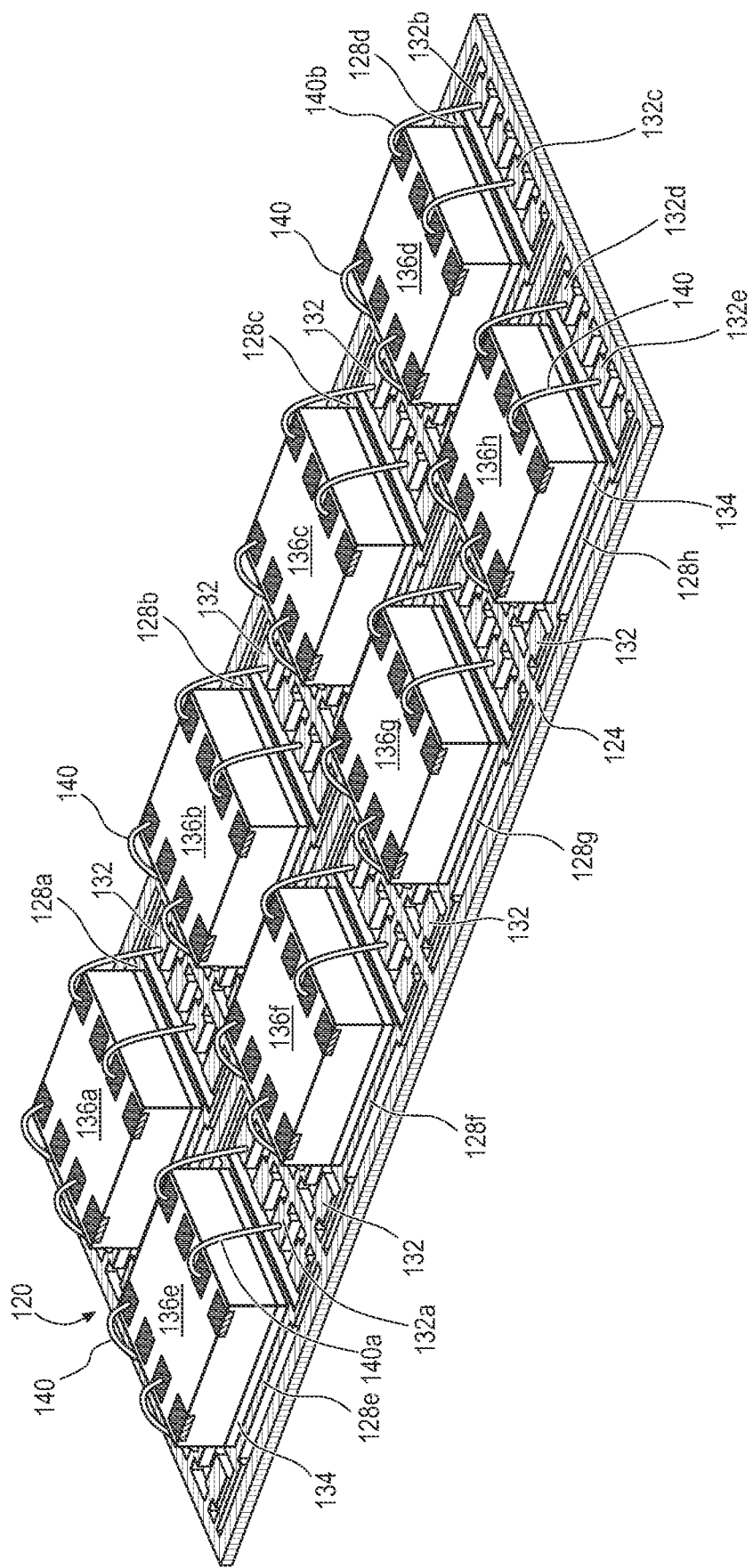
Figure 2I:
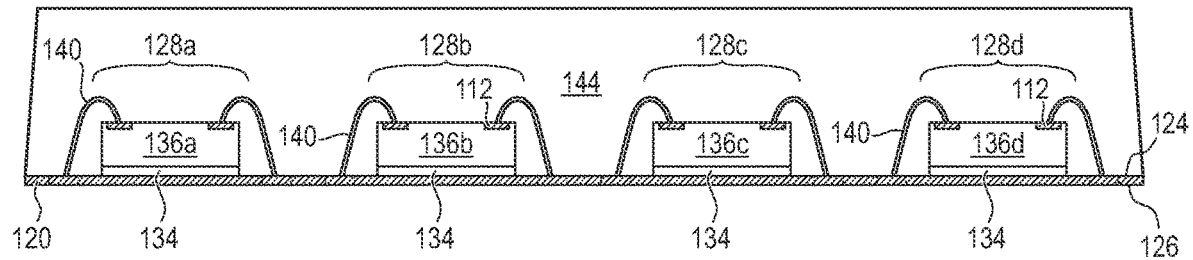
Figure 2J:
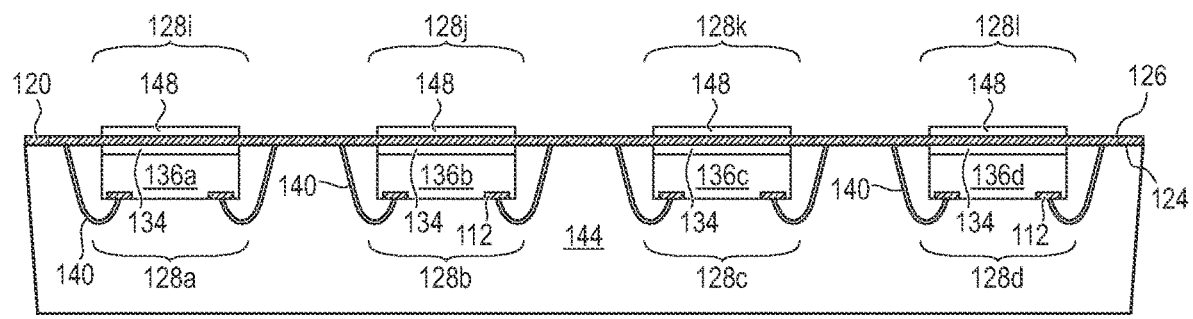
Figure 2K:
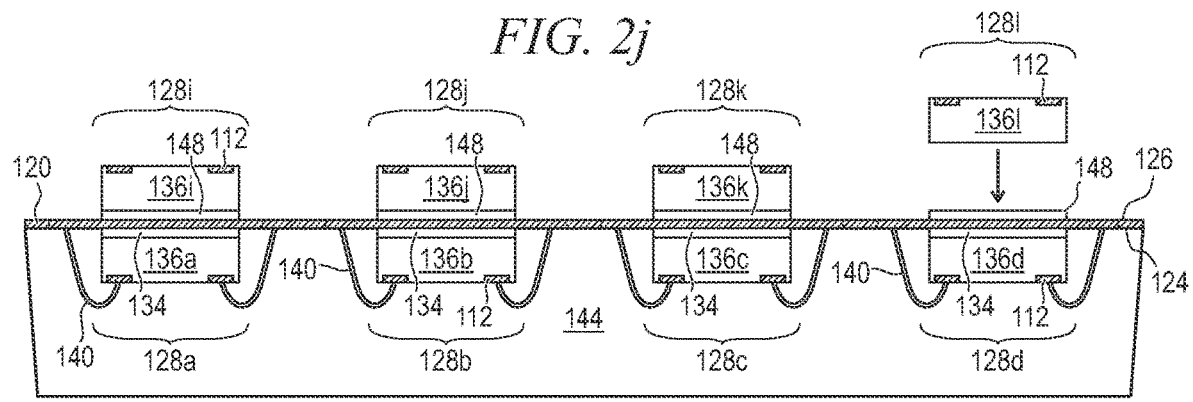
Figure 2L:
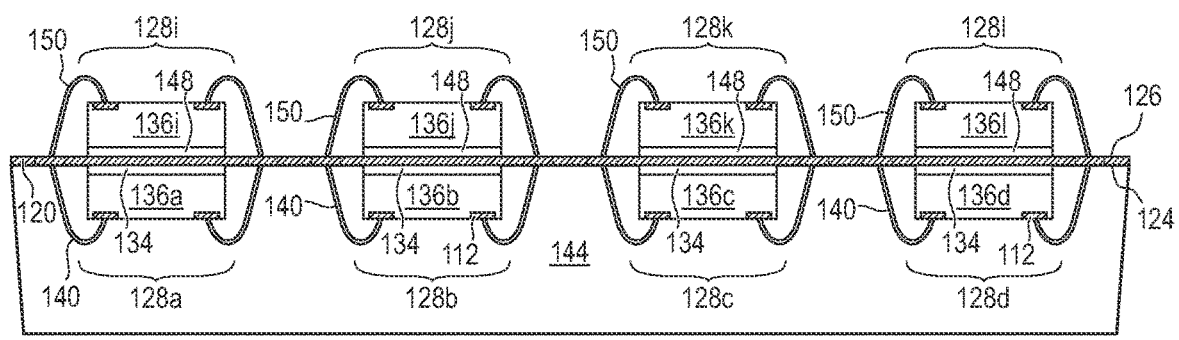
Figure 2M:
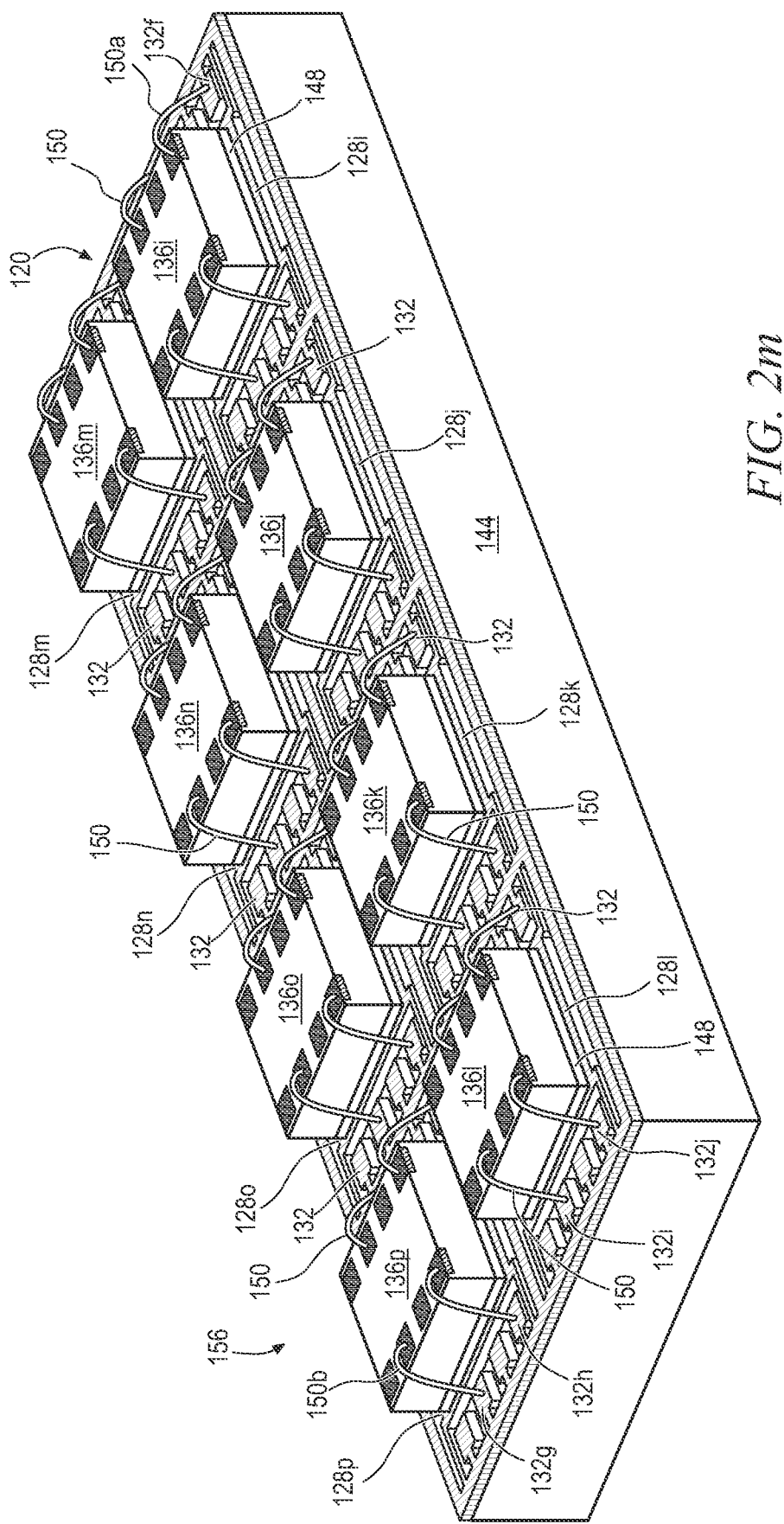
Figure 2N:
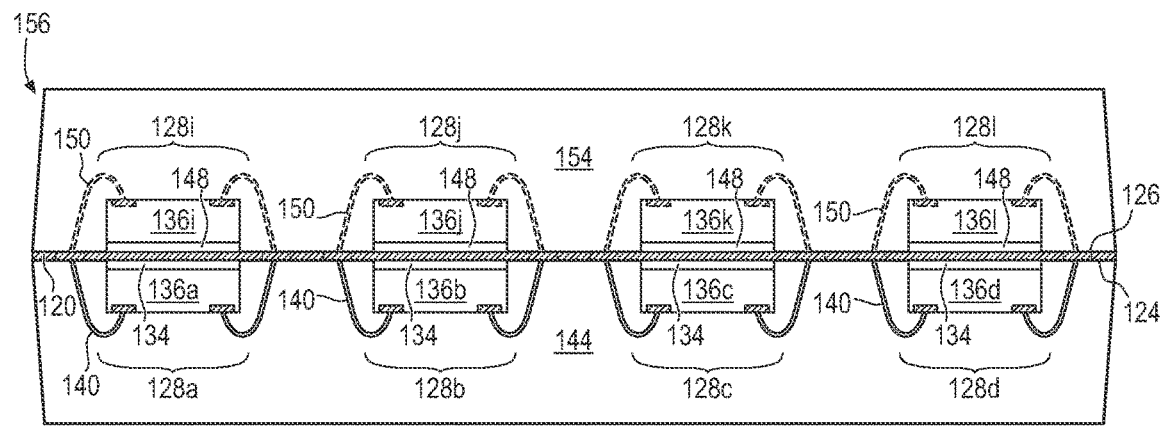
Figure 2O:
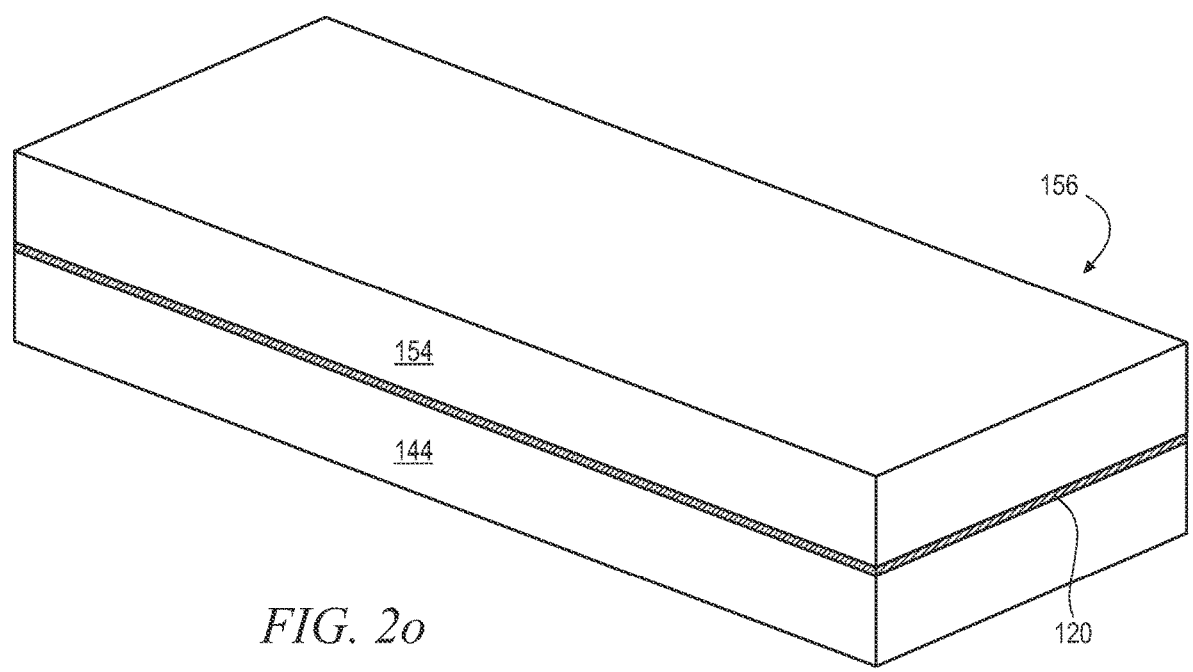
Figure 2P:
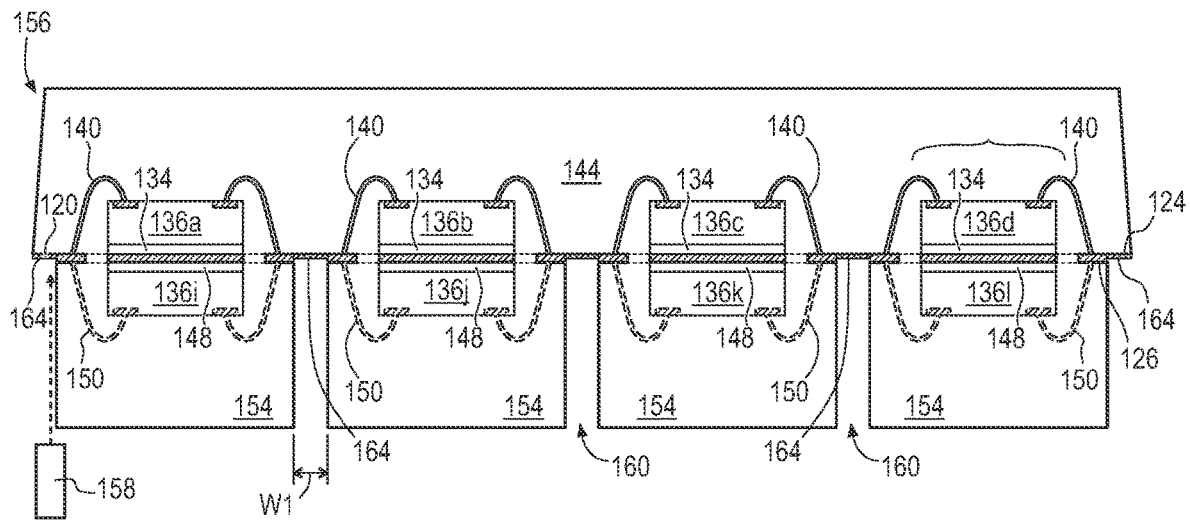
Figure 2Q:
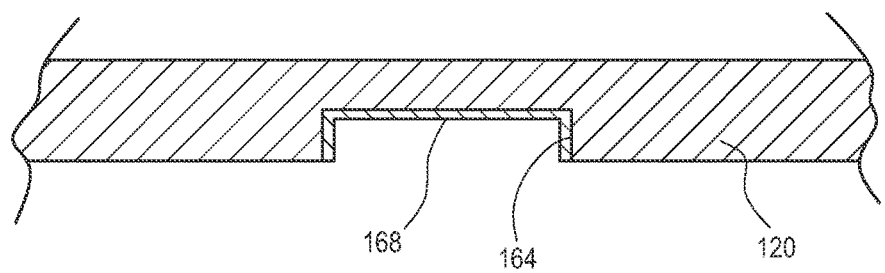
Figure 2R:
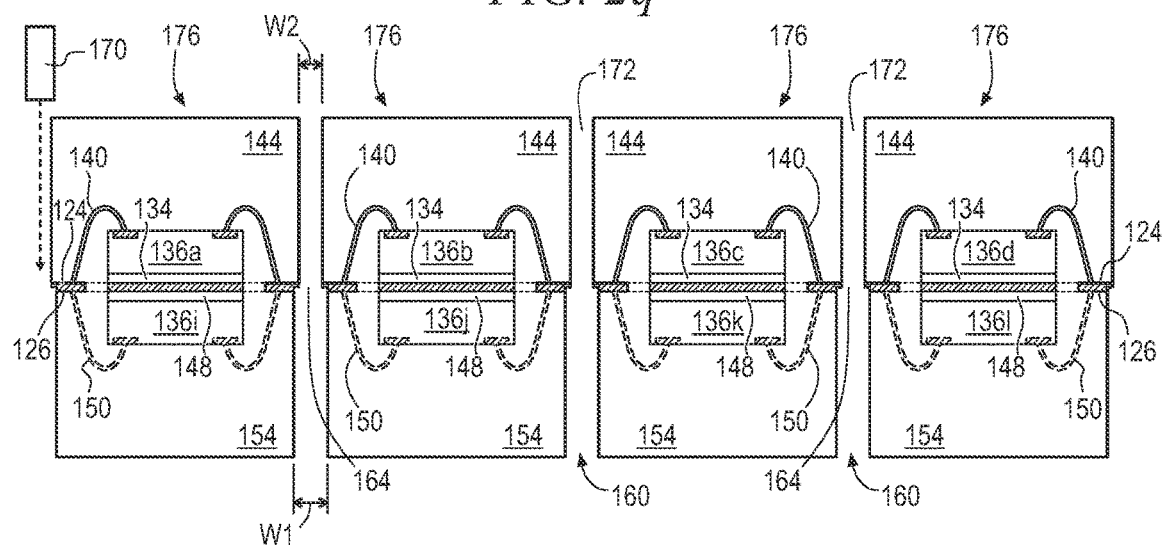

FIGS. 2a-2r illustrate a process of disposing electrical components above and below a substrate with exposed leads. FIG. 2a shows a cross-sectional view of interconnect substrate or leadframe 120. Substrate 120 includes surface 124 and surface 126 opposite surface 124. FIG. 2b is a top view of a portion of substrate 120 with a plurality of die mounting sites die 128a-128h and leads 132 adjacent to the die mounting sites. Leadframe 120 can be made from Au, Ag, Ni, Pt, Cu, Cu alloys (including one or more elements of nickel, iron, zinc, tin, chromium, silver, and phosphorous), or other suitable conductive materials. Leadframe 120 can be a pre-plated substrate (PPF) or laminated substrate. Leadframe 120 can be stamped, etched, or 3D laser printed into any shape corresponding to a substrate form and function. Leadframe 120 provides structural support and electrical interconnection for electrical components, such as semiconductor die 104. FIG. 2c shows a perspective view of leadframe 120 with die mounting sites 128a-128h and leads 132. Leadframe 120 will be cut post encapsulation to electrically and physically isolate die mounting sites 128a-128h and leads 132.

FIGS. 2b-2c show leadframe 120 with leads 132 on two opposite sides of each die mounting site 128a-128h. FIG. 2d shows an embodiment of a portion of leadframe 120 with leads 132 on each side of die mounting sites 128a-128h. Although leadframe 120 is shown in FIG. 2d with four leads 132 on each side, the leadframe can have any number of leads on any side.

In another embodiment, interconnect substrate 120 can be base substrate 130 with metal routing or circuitry as leads 132, as shown in FIG. 2e. Base substrate 130 can be silicon, germanium, aluminum phosphide, aluminum arsenide, gallium arsenide, gallium nitride, indium phosphide, silicon carbide, polymer, or other non-conductive bulk material for structural support. Die mounting sites die 128a-128h are designated on the non-conductive bulk material of substrate 130. Leads 132 are formed through base substrate 130 and exposed from the top and bottom major surfaces of the substrate.

The following text describes electrical components 136a-136d being disposed on die mounting sites 128a-128d, to simplify the explanation. Electrical components 136e-136h would be placed on die mounting sites 128e-128h, i.e., an electrical component 136x for each die mounting site 128x on leadframe 120, where x represents any number of electrical components and die mounting sites. Electrical components 136a-136x may be the same type of electrical component or different electrical components.

In FIG. 2f, adhesive material 134 is disposed on die mounting sites 128a-128d. Electrical components 136a-136d are positioned over die mounting sites 128a-128d of substrate 120 using a pick and place operation. For example, electrical components 136a-136d can be semiconductor die 104 from FIG. 1c with back surface 108 oriented toward die mounting sites 128a-128d, respectively. Electrical components 136a-136x can be discrete semiconductor devices, such as resistors, capacitors, inductors, diodes, transistors, and the like. Alternatively, electrical components 136a-136x can include other semiconductor die, semiconductor package, surface mount device, discrete electrical device, discrete transistor, diode, or IPD.

FIG. 2g shows electrical components 136a-136d mounted to die mounting sites 128a-128d with adhesive material 134. A plurality of bond wires 140 is bonded between conductive layer 112 of semiconductor die 104 and leads 132 around each die mounting site 128a-128d. Bond wires 140 make mechanical and electrical connection between leads 132 and conductive layer 112 of electrical components 136a-136d.

FIG. 2h shows a perspective view of electrical components 136a-136h disposed over die mounting dies 128a-128h with bond wires 140 bonded between conductive layer 112 of semiconductor die 104 and leads 132, as an illustration. For example, bond wire 140a is bonded to lead 132a, and bond wire 140b is bonded to lead 132b. Notice bond wires 140 are bonded to alternate leads 132. Only a portion of leads 132 is used for electrical interconnect with electrical components 136a-136h disposed on surface 124 of leadframe 120. Other leads 132 will be used for electrical interconnect with electrical components disposed on surface 126 of leadframe 120, as described infra. For example, electrical components 128a-128f will connect by bond wires 140 to leads 132b, 132c, 132d, and 132e.

In FIG. 2i, encapsulant or molding compound 144 is deposited over and around electrical components 136a-136d, surface 124 of substrate 120, and bond wires 140 using a paste printing, compressive molding, transfer molding, liquid encapsulant molding, vacuum lamination, film assisted molding (FAM), or other suitable applicator. Encapsulant 144 can be polymer composite material, such as epoxy resin with filler, epoxy acrylate with filler, or polymer with proper filler. Encapsulant 144 is non-conductive, provides structural support, and environmentally protects the electrical components from external elements and contaminants.

In FIG. 2j, substrate 120 is inverted to show die mounting sites or flags 128i-128l on surface 126 of the substrate, opposite with respect to surface 124 and die mounting sites 128a-128d and electrical components 136a-136d. Die mounting sites 128i-128l are the opposite surface of leadframe 120 with respect to die mounting sides 128a-128d. Adhesive material 148 is disposed on die mounting sites 128i-128l.

In FIG. 2k, electrical components 136i-136l are positioned over die mounting sites 128i-128l of substrate 120 using a pick and place operation. For example, electrical components 136i-136l can be semiconductor die 104 from FIG. 1c with back surface 108 oriented toward die mounting sites 128i-128l, respectively. Alternatively, electrical components 136i-136l can be made similar to electrical elements 136a-136d, although with a different electrical function, or electrical components 136i-136l can be completely different in form and function.

FIG. 2l shows electrical components 136i-136l mounted to die mounting sites 128i-128l with adhesive material 148. A plurality of bond wires 150 is bonded between conductive layer 112 of electrical components 136i-136l and leads 132 around each die mounting site 128i-128l. Bond wires 150 make mechanical and electrical connection between leads 132 and conductive layer 112 of electrical components 136i-136l.

FIG. 2m shows a perspective view of bond wires 150 bonded between conductive layer 112 of electrical components 136i, 136j, 136m, and 136n and leads 132. For example, bond wire 150a is bonded to lead 132g, and bond wire 150b is bonded to lead 132h. As discussed above, some leads 132 are used for electrical components disposed on surface 124 and other leads 132 are used for electrical components on surface 126. Accordingly, electrical components 136i-136p disposed on surface 126 of leadframe 120 will connect by bond wires 150 to leads such as 132h, 132i, 132j, and 132k. Placing electrical components 136a-136h and 136i-136p on opposite sides of substrate 120 shortens the lead length, reduces propagation delay, improves performance, and increases reliability. Any number of electrical components can be disposed on surface 124 and/or surface 126 of leadframe 120.

In FIG. 2n, encapsulant or molding compound 154 is deposited over and around electrical components 136i-136l, surface 126 of substrate 120, and bond wires 150 using a paste printing, compressive molding, transfer molding, liquid encapsulant molding, vacuum lamination, FAM, or other suitable applicator. Encapsulant 154 can be polymer composite material, such as epoxy resin with filler, epoxy acrylate with filler, or polymer with proper filler. Encapsulant 154 is non-conductive, provides structural support, and environmentally protects the electrical components from external elements and contaminants. Semiconductor assembly 156 contains electrical components 136a-136x attached to opposite surfaces 124 and 126 of substrate 120 and covered by encapsulants 144 and 154. Semiconductor assembly 156 may be inverted again, or not, depending on preferred external lead orientation of the semiconductor package. FIG. 2o shows a perspective view of semiconductor assembly 156 with substrate 120 and encapsulant 144 and 154 on opposite surfaces of the substrate.

In FIG. 2p, semiconductor assembly 156 is inverted with surface 124 facing upward. A first cut is made through encapsulant 154 using saw blade or laser cutting tool 158. The cutting operation forms channel 160 through encapsulant 154 with a width W1 in the range of 300-400 micrometers (μm). The cut extends partially through leadframe 120 to form notches 164. FIG. 2q shows further detail of notch 164. In one embodiment, metal layer 168 is formed in notch 164, using electroless plating or sputtering, to enhance external electrical connection.

In FIG. 2r, a second cut is made through encapsulant 144 using saw blade or laser cutting tool 170. The cut forms channel 172 extending through the remaining portion of substrate 120 to singulate semiconductor assembly 156 into semiconductor packages 176. Channel 172 has width W2 which is less than width W1. In one embodiment, the width W2 is in the range of 200-300 μm.

Figure 3A:
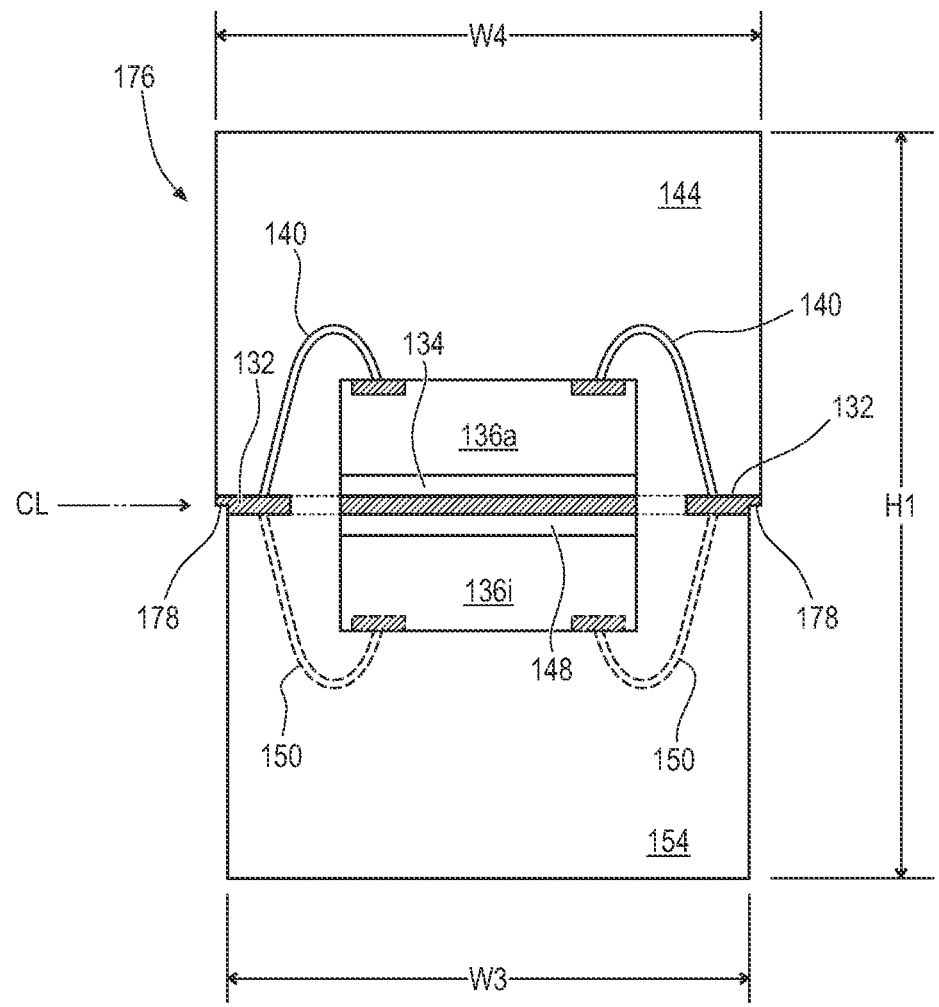
FIGS. 3a-3e illustrate the semiconductor package from FIG. 2m mounted to a PCB.

FIG. 3a shows semiconductor package 176 post singulation. Semiconductor package 176 includes electrical component 136a disposed on surface 124 of substrate 120 over die mounting site 128a, and electrical component 136i disposed on surface 126 of substrate 120 over die mounting site 128i. Accordingly, electrical components 136a and 136i are disposed on opposite sides of substrate 120. Semiconductor package 176 has width W3 and width W4, with W4>W3 by nature of W1>W2. Each bond wire 140 electrically connects conductive layer 112 on electrical component 136a to one lead 132, see FIG. 2h. Each bond wire 150 electrically connects conductive layer 112 on electrical component 136i to another lead 132, see FIG. 2m. Leads 132 have a central location CL, with respect to height H1, for external access relative to semiconductor package 176.

Figure 3B:
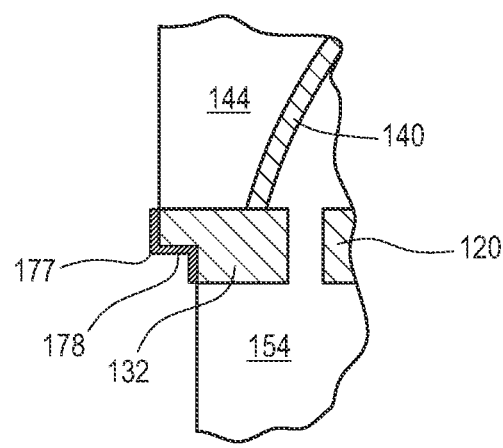

FIG. 3b shows further detail of lead 132 in semiconductor package 176. The difference in width W1 of channel 160 and width W2 of channel 172, as well as different widths W3 and W4 of semiconductor package 176, forms notch 178 in lead 132. In one embodiment, metal layer 177 is formed on notch 178 of leads 132 using electroless plating or sputtering, to enhance external electrical connection.

Figure 3C:
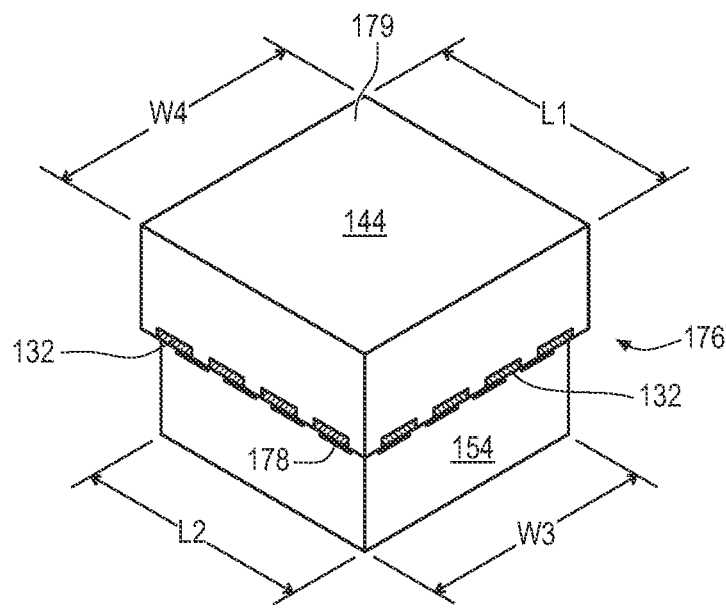

FIG. 3c is a perspective view of semiconductor package 176 with lead 132 and notch 178 exposed from encapsulants 144 and 154. In particular, the difference in width W1 of channel 160 and width W2 of channel 172 leaves encapsulant 144 with a greater length L1 and width W4, as compared to the length L2 and width W3 of encapsulant 154. Encapsulant 144 has a length L1 and width W4. Encapsulant 154 has a length L2 and width W3. Encapsulant 144 has a larger surface area 179 than a comparable surface area of encapsulant 154.

Figure 3D:
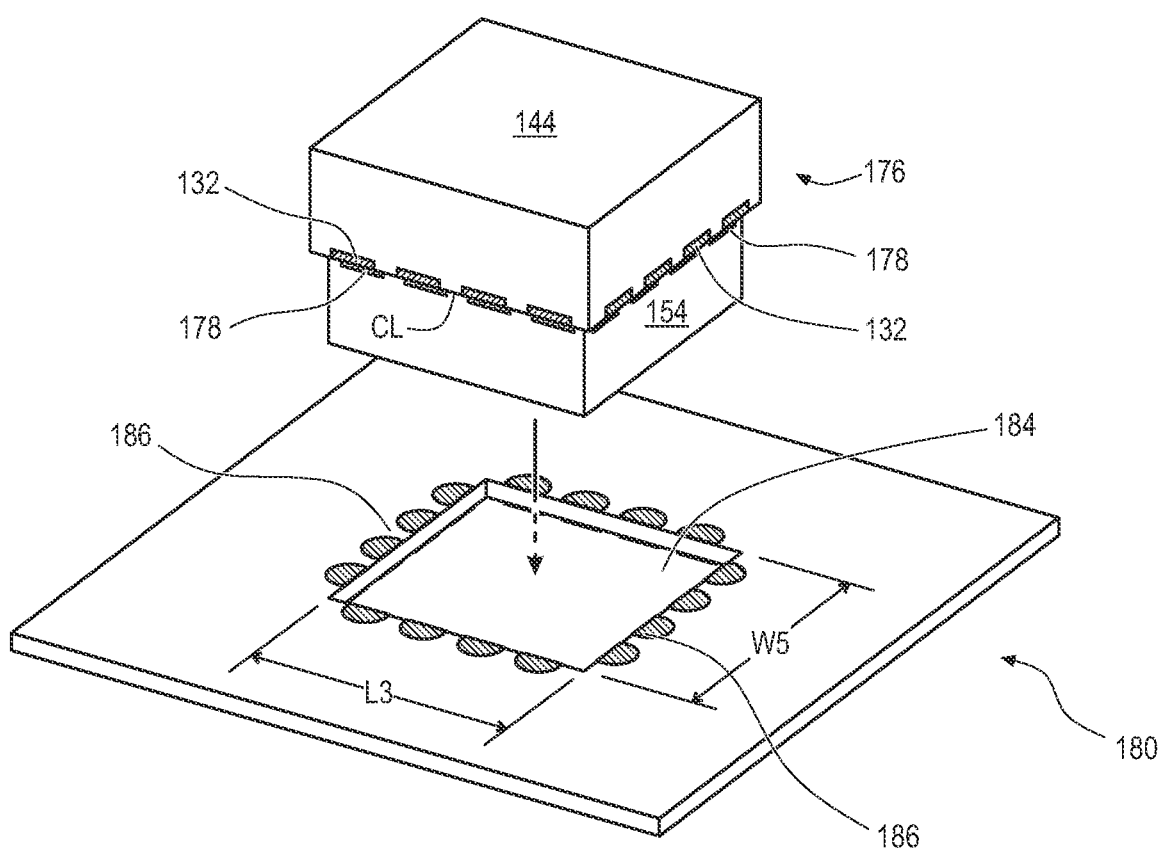
Figure 3E:
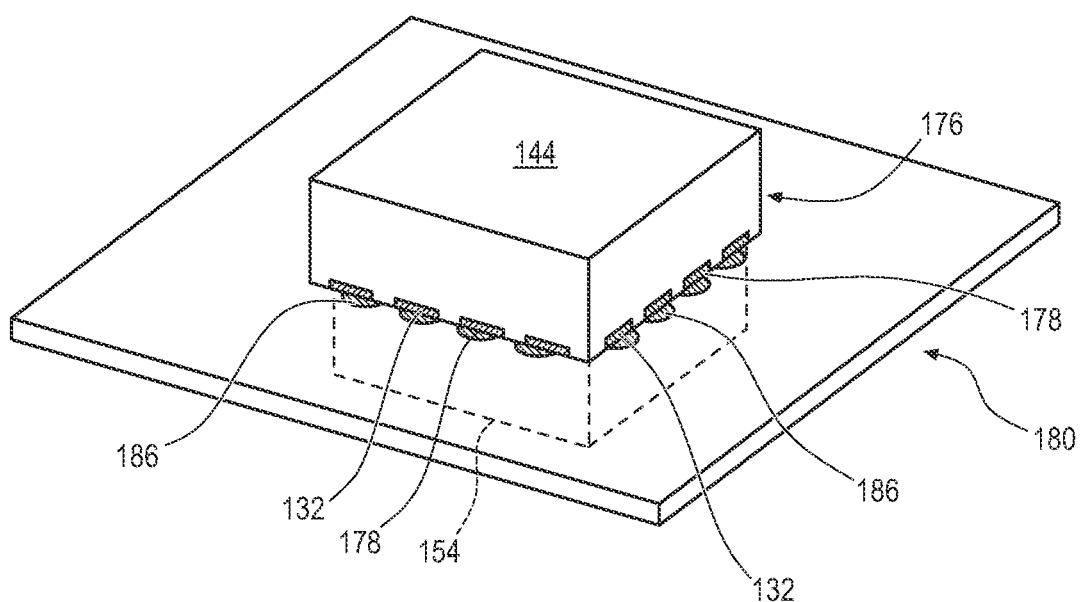

FIG. 3d shows PCB 180 for mounting semiconductor package 176. PCB 180 includes opening 184 sized to receive the dimensions of encapsulant 154 but is too small for the dimensions of encapsulant 144. Opening 184 has a length L3 and width W5. Electrical contacts 186 are formed on PCB 180 around a perimeter of opening 184. Semiconductor package 176 is disposed over opening 184 using a pick and place operation. Semiconductor package 176 is lowered into opening 184. Encapsulant 154 of semiconductor package 176 passes through opening 184, but encapsulant 144 having larger dimensions does not pass through the opening. Notches 178 of lead 132 come to rest on electrical contacts 186, as shown in FIG. 3e. Semiconductor package 176 encloses electrical component 136a on surface 124 above PCB 180, and electrical component 136i on surface 126 below the PCB. Leads 132 make electrical and mechanical connection to contacts 186 leading to other components on PCB 180.

Alternatively, the first cut of semiconductor assembly 156 could have been made through encapsulant 144 and the second cut made through encapsulant 154, see FIGS. 2p and 2r. In that case, semiconductor package 176 would enclose electrical component 136i on surface 126 above PCB 180, and electrical component 136a on surface 124 below the PCB.

Semiconductor package 176 includes substrate 120 and dual electrical components 136, placed above and below the substrate. Electrical components 136 are electrically connected to leads 132, and encapsulants 144 and 154 cover the electrical components, bond wires, and substrate. Semiconductor package 176 is securely held in place within opening 184 of PCB 180. Leads 132 have exposure along central location CL of side surfaces of semiconductor package 176 for ease of external access, particularly when placed in opening 184 of PCB 180. Semiconductor package 176 provides space efficient with package stacking, and high component density per unit area of PCB 180. Semiconductor package 176 can provide more electrical functionality in a smaller footprint on PCB 180. Semiconductor package 176 further provides better product performance and reliability with shorter lead length between electrical components 136 on opposite surfaces of substrate 120, as well as reduced propagation delay and higher speed of operation.

Figure 4A:
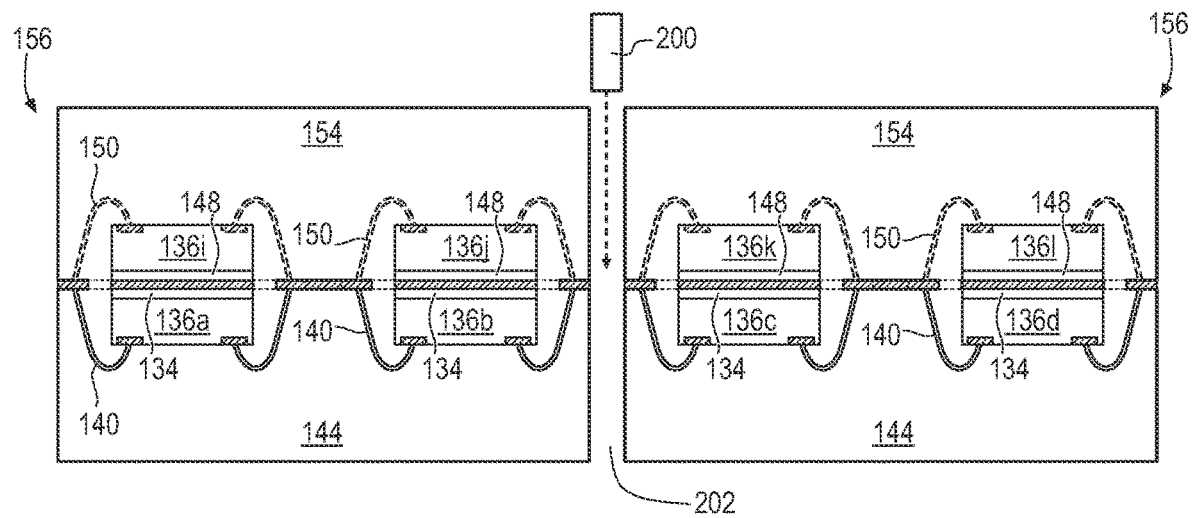
FIGS. 4a-4d illustrate another process of disposing electrical components above and below a substrate with exposed leads.
Figure 4B:
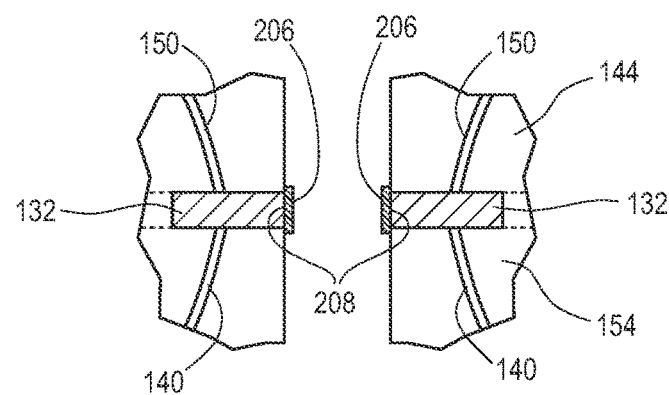

In another embodiment, continuing from FIG. 2n, a first cut is made through encapsulant 154, leadframe 120, and encapsulant 144 using saw blade or laser cutting tool 200, as shown in FIG. 4a. The cutting operation forms channel 202 through encapsulant 154, leadframe 120, and encapsulant 144. In one embodiment, metal layer 206 is formed on sidewalls 208 of leads 132 using electroless plating or sputtering, to enhance external electrical connection, as shown in FIG. 4b.

Figure 4C:
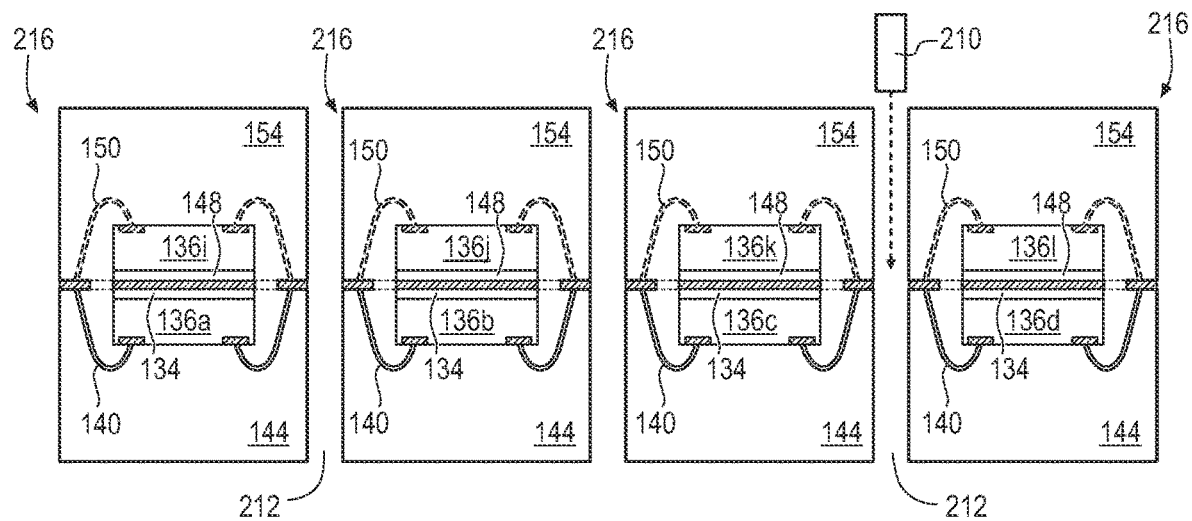
Figure 4D:
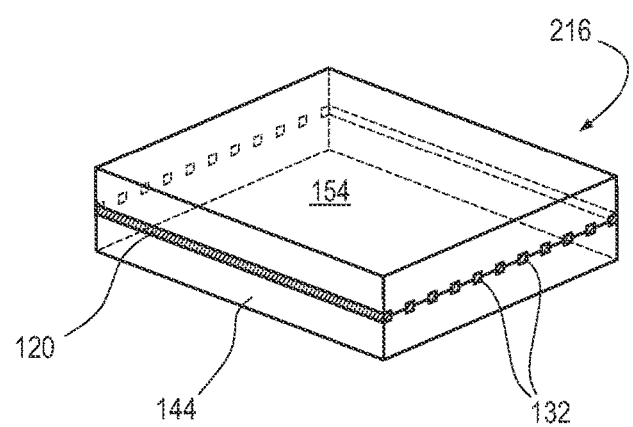

In FIG. 4c, a second cut is made through encapsulant 154, leadframe 120, and encapsulant 144 using saw blade or laser cutting tool 210. The cut forms channels 212 extending through encapsulant 154, leadframe 120, and encapsulant 144 to singulate semiconductor assembly 156 into semiconductor packages 216. Metal layer 206 can be formed on sidewalls 208 of leads 132 using electroless plating or sputtering, to enhance external electrical connection, similar to FIG. 4b. FIG. 4d is a perspective view of semiconductor package 216 with leads 132 exposed from encapsulants 144 and 154.

FIG. 5a shows semiconductor package 216 post singulation. Semiconductor package 216 includes electrical component 136a disposed on surface 124 of substrate 120 over die mounting site 128a, and electrical component 136i disposed on surface 126 of substrate 120 over die mounting site 128i. Accordingly, electrical components 136a and 136i are disposed on opposite sides of substrate 120. Each bond wire 140 electrically connects conductive layer 112 on electrical component 136a to one lead 132, see FIG. 2h. Each bond wire 150 electrically connects conductive layer 112 on electrical component 136i to another lead 132, see FIG. 2m.

FIG. 5b shows further detail in a perspective view of external connection of lead 132 exposed from encapsulants 144 and 154 in semiconductor package 216, on a first side 218a of the package relative to FIG. 5a. FIG. 5c shows further detail in a perspective view of external connection of lead 132 exposed from encapsulants 144 and 154 in semiconductor package 216, on a second side 218b opposite the first side 218a of the package relative to FIG. 5a. Leads 132 have a central location CL for external access relative to semiconductor package 216.

Figure 5D:
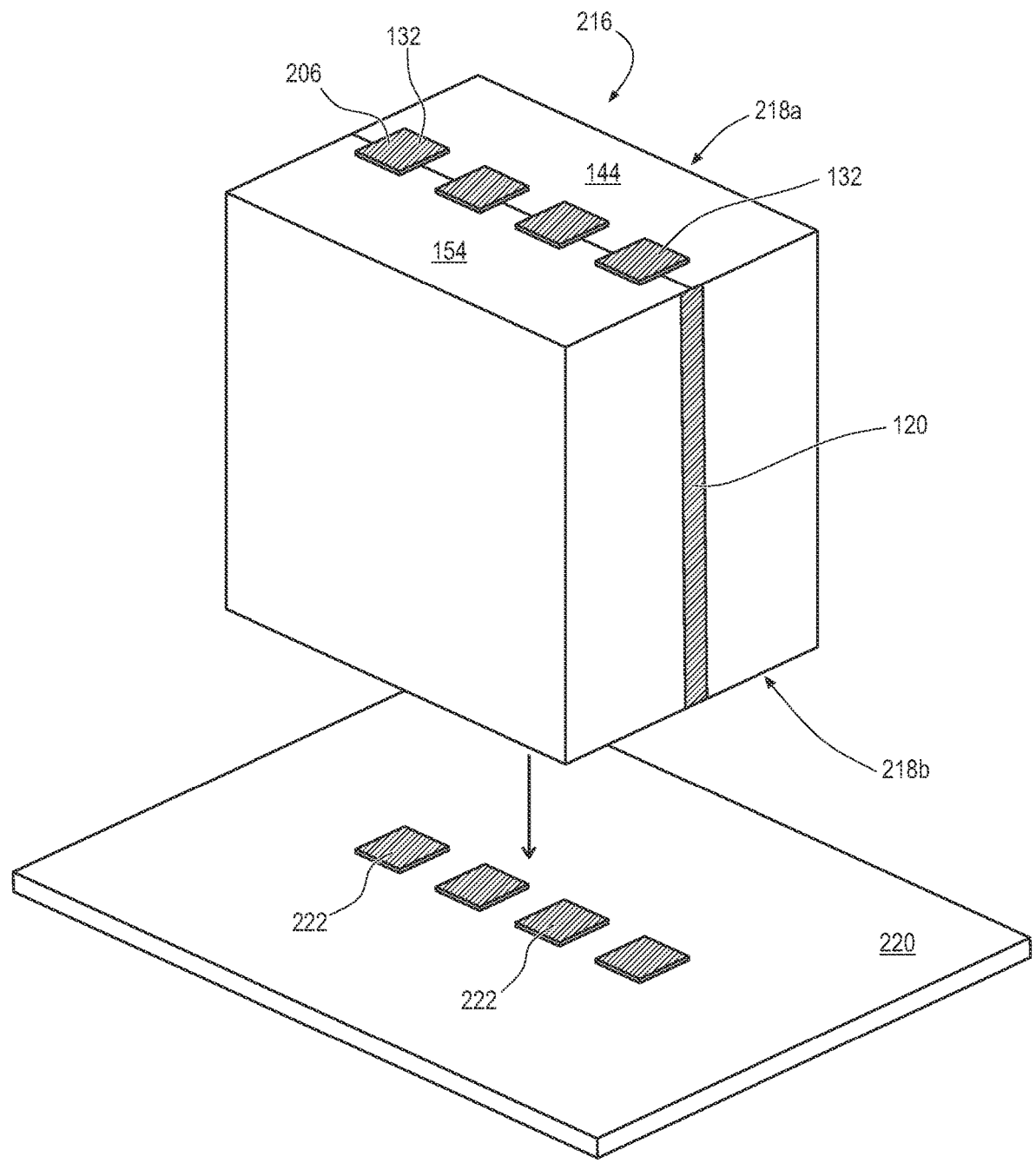
Figure 5E:
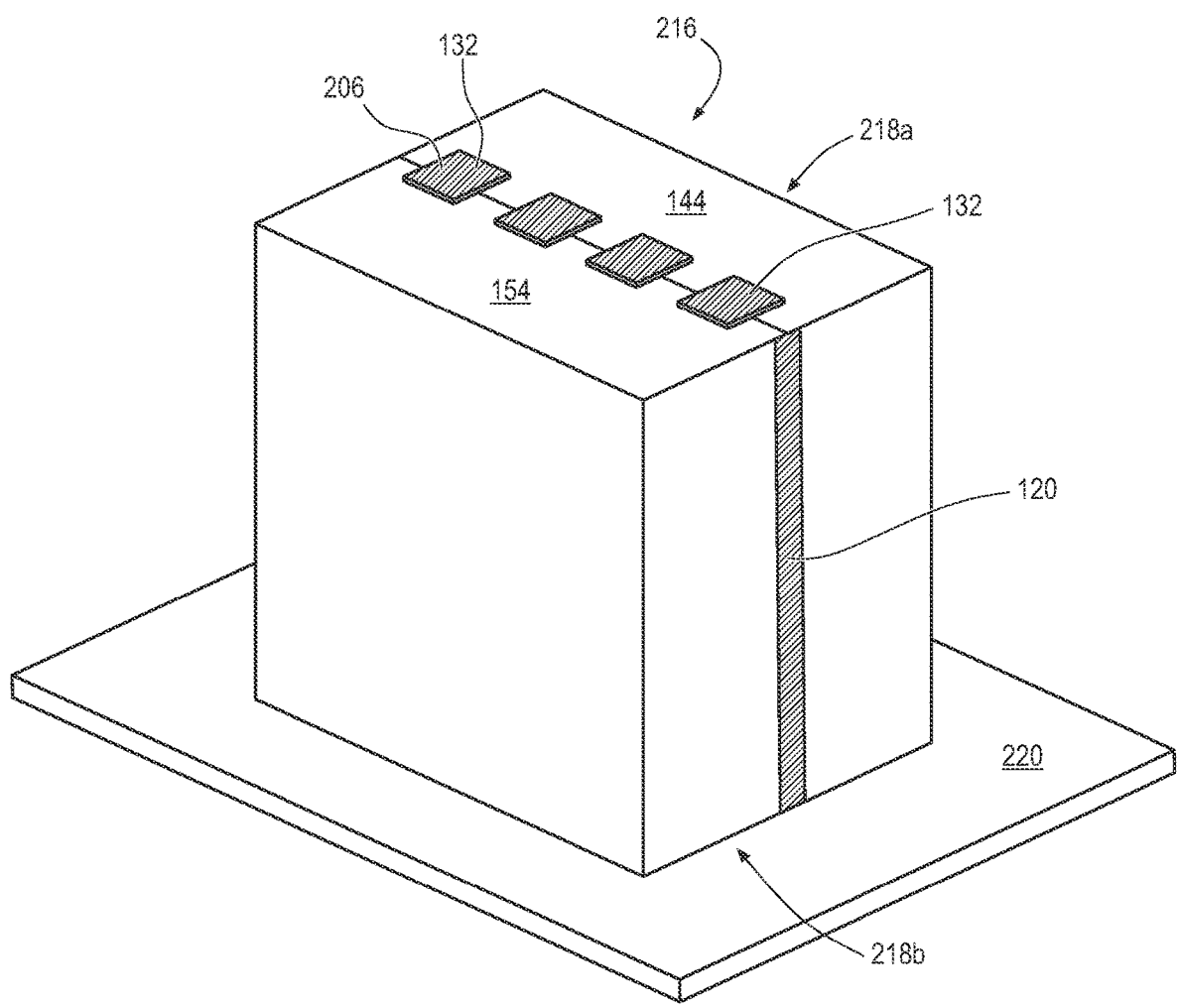

FIG. 5d shows PCB 220 for mounting semiconductor package 216. Semiconductor package 216 is disposed over PCB 220 with side 218b facing down toward electrical contacts 222, using a pick and place operation. In FIG. 5e, semiconductor package 216 is disposed onto PCB 220 so that leads 132 on side 218b make mechanical and electrical connection with corresponding electrical contacts 222 on the PCB. Leads 132 on side 218a are available for additional electrical interconnect to semiconductor package 216. Semiconductor package 216 encloses electrical component 136a on surface 124, and electrical component 136i on surface 126, above PCB 220. Leads 132 on side 218b make electrical and mechanical connection to contacts on PCB 220 leading to other components on the PCB. Alternatively, leads 132 on side 218a may contact PCB 220 and leads 132 on side 218a are available for additional electrical interconnect to semiconductor package 216.

Semiconductor package 216 includes substrate 120 and dual electrical components 136, placed above and below the substrate. Electrical components 136 are electrically connected to leads 132, and encapsulants 144 and 154 cover the electrical components, bond wires, and substrate. Leads 132 have exposure along a central location CL of side surfaces of semiconductor package 216 for ease of external access. Semiconductor package 216 provides space efficient with package stacking, and high component density per unit area of PCB 220. Semiconductor package 216 can provide more electrical functionality in a smaller footprint on PCB 220. Semiconductor package 216 further provides better product performance and reliability with shorter lead length between electrical components 136 on opposite surfaces of substrate 120, as well as reduced propagation delay and higher speed of operation.

Figure 6A:
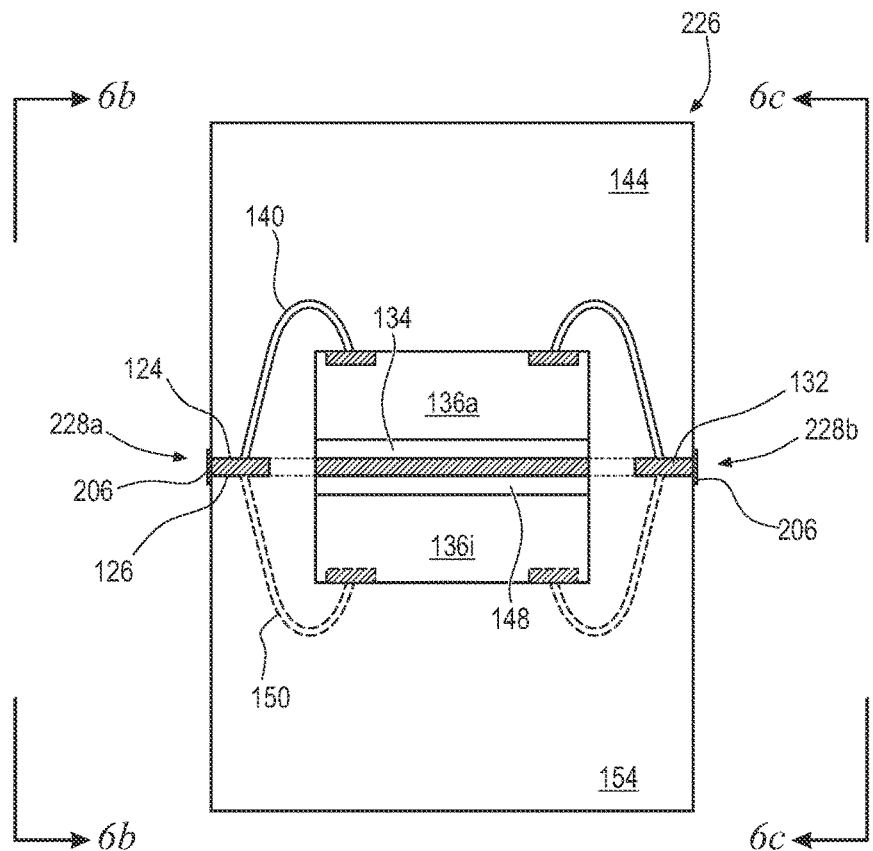
FIGS. 6a-6d illustrate another semiconductor package mounted to a PCB.

In another embodiment, continuing from FIG. 4c, semiconductor package 226 is shown post singulation in FIG. 6a. Semiconductor package 226 includes electrical component 136a disposed on surface 124 of substrate 120 over die mounting site 128a, and electrical component 136i disposed on surface 126 of substrate 120 over die mounting site 128i. Accordingly, electrical components 136a and 136i are disposed on opposite sides of substrate 120. Each bond wire 140 electrically connects conductive layer 112 on electrical component 136a to one lead 132, see FIG. 2h. Each bond wire 150 electrically connects conductive layer 112 on electrical component 136i to another lead 132, see FIG. 2m.

Figure 6B:
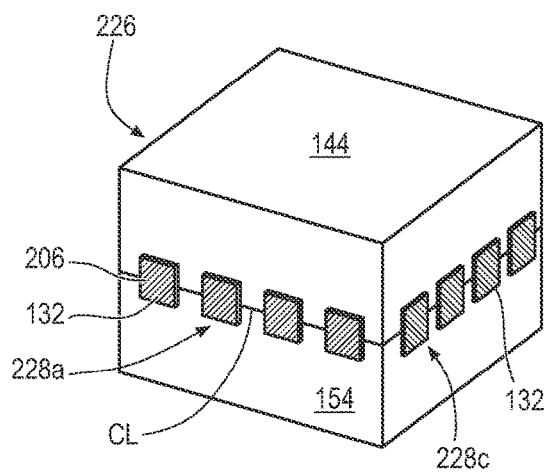
Figure 6C:
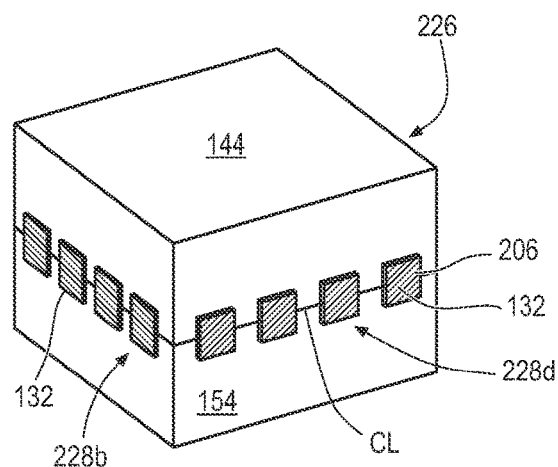

FIG. 6b shows further detail in a perspective view of external connection of lead 132 exposed from encapsulants 144 and 154 in semiconductor package 226, on sides 228a and 228c of the package relative to FIG. 6a. FIG. 6c shows further detail in a perspective view of external connection of lead 132 exposed from encapsulants 144 and 154 in semiconductor package 226, on side 228b opposite side 218a and side 228d opposite side 228c of the package relative to FIG. 6a. Leads 132 have a central location CL for external access relative to semiconductor package 226.

Figure 6D:
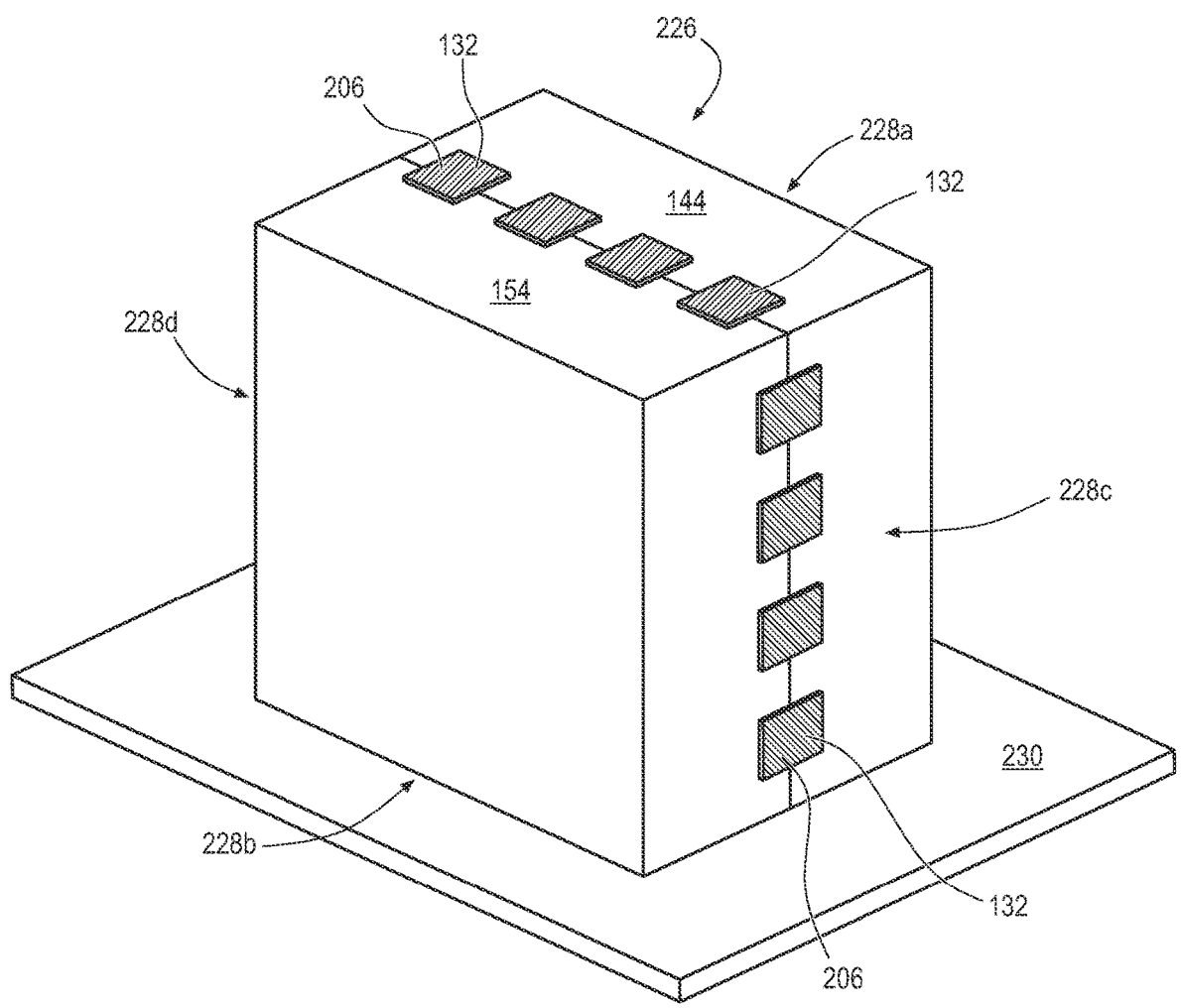

FIG. 6d shows PCB 230 for mounting semiconductor package 226. Semiconductor package 266 is disposed over PCB 230 with side 228b facing down, using a pick and place operation. Semiconductor package 226 is lowered onto PCB 230 so that leads 132 on side 228b make mechanical and electrical connection with corresponding terminals on the PCB, similar to FIGS. 5d-5e. Leads 132 on sides 228a, 228c, and 228d are available for additional electrical interconnect to semiconductor package 226. Semiconductor package 226 in FIG. 6d encloses electrical component 136a on surface 124, and electrical component 136i on surface 126, above PCB 230. Leads 132 on side 228b make electrical and mechanical connection to contacts on PCB 230 leading to other components on the PCB. Alternatively, leads 132 on side 228a, or on side 228c, or on side 228d may contact PCB 230 and leads 132 on other sides are available for additional electrical interconnect to semiconductor package 226.

Semiconductor package 226 includes substrate 120 and dual electrical components 136, placed above and below the substrate. Electrical components 136 are electrically connected to leads 132, and encapsulants 144 and 154 cover the electrical components, bond wires, and substrate. Leads 132 have exposure along a central location CL of side surfaces of semiconductor package 226 for ease of external access. Semiconductor package 226 provides space efficient with package stacking, and high component density per unit area of PCB 230. Semiconductor package 226 can provide more electrical functionality in a smaller footprint on PCB 230. Semiconductor package 236 further provides better product performance and reliability with shorter lead length between electrical components 136 on opposite surfaces of substrate 120, as well as reduced propagation delay and higher speed of operation.

Figure 7A:
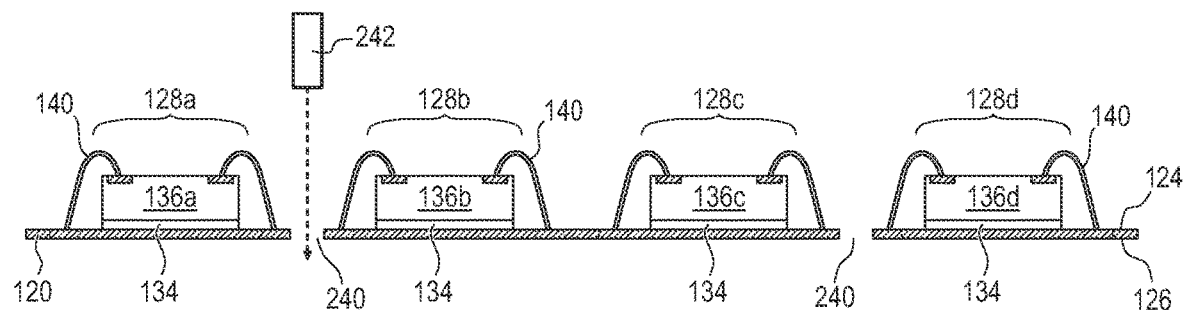
FIGS. 7a-7d illustrate another process of disposing electrical components above and below a substrate with exposed leads.
Figure 7B:
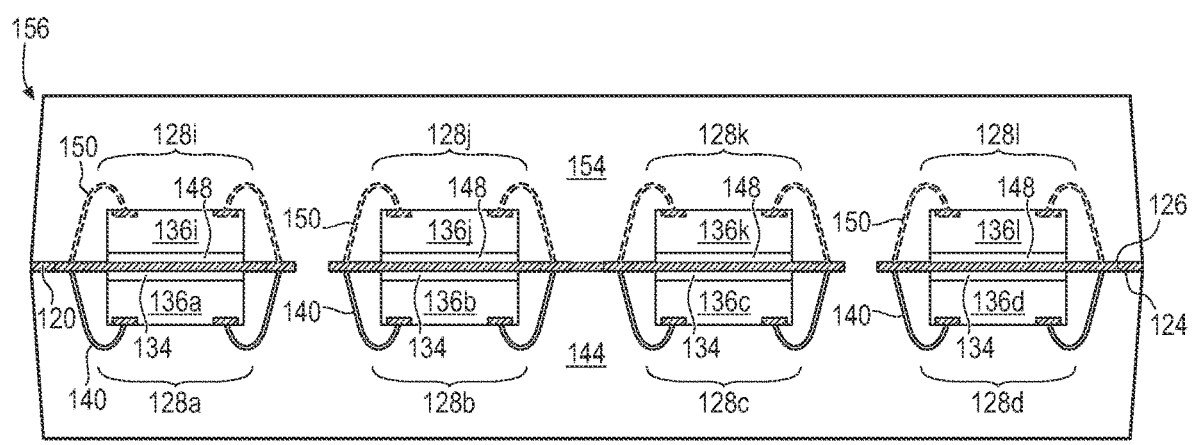

In another embodiment, continuing from FIG. 2g, cuts 240 are made through leadframe 120 using saw blade or laser cutting tool 242, as shown in FIG. 7a. Metal layer 244 can be formed on the sidewalls of leads 132 using electroless plating or sputtering, to enhance external electrical connection. An encapsulant or molding compound 144 is deposited over and around electrical components 136a-136d, surface 124 of substrate 120, and bond wires 140, similar to FIG. 2i. Electrical components 136i-136l are mounted to die mounting sites 128i-128l with adhesive material 148, similar to FIGS. 2j-2m. A plurality of bond wires 150 is bonded between conductive layer 112 of electrical components 136e-136h and leads 132 around each die mounting site 128i-128l. Encapsulant or molding compound 154 is deposited over and around electrical components 136i-136l, surface 126 of substrate 120, and bond wires 150, similar to FIG. 2n.

Figure 7C:
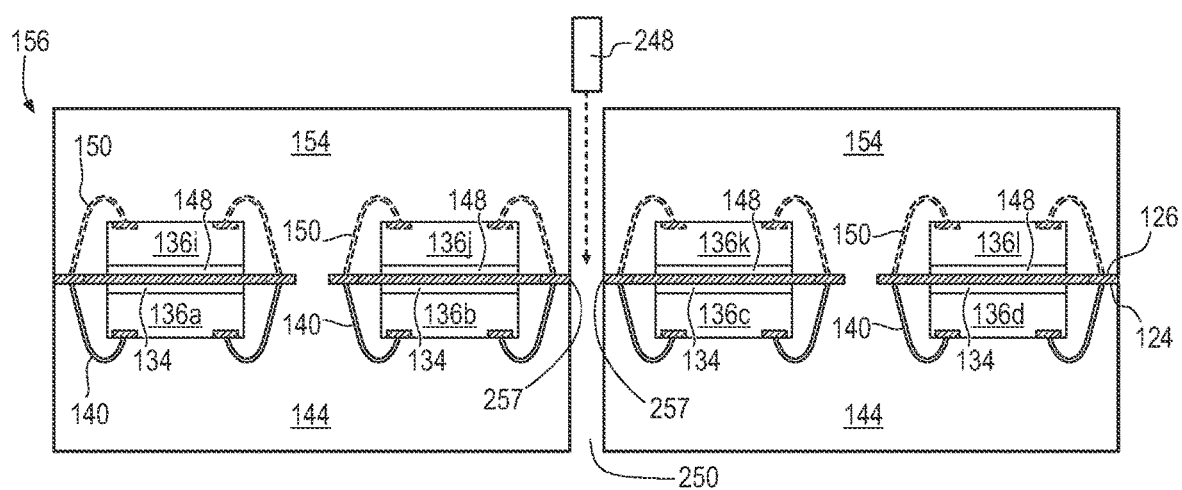
Figure 7D:
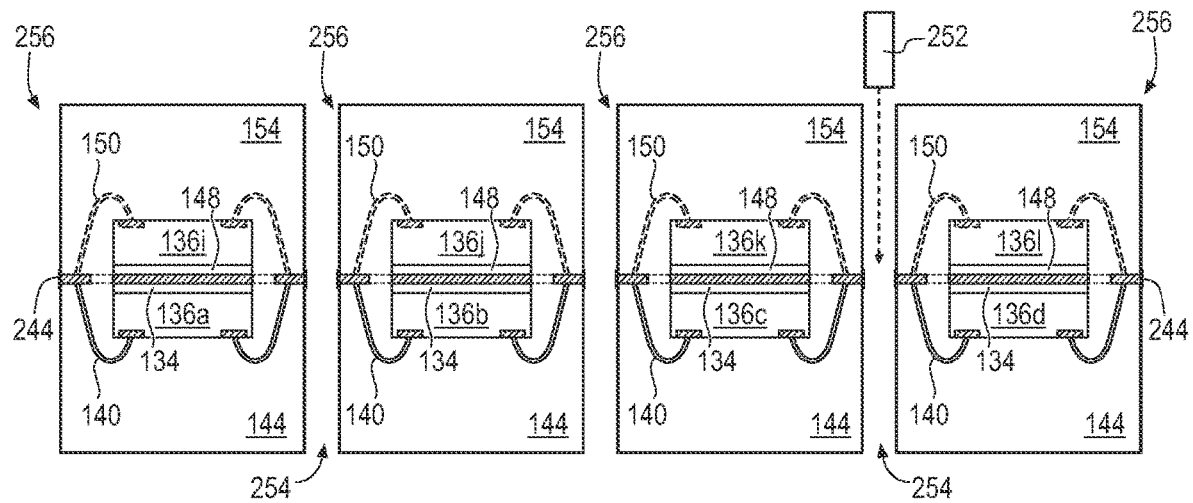

In FIG. 7c, a first cut is made through encapsulant 154 using saw blade or laser cutting tool 248. The cutting operation forms channel 250 through encapsulant 154, similar to FIG. 4a. Metal layer 257 can be formed on sidewalls 208 of leads 132 using electroless plating or sputtering, to enhance external electrical connection, similar to FIG. 4b. In FIG. 7d, a second cut is made through encapsulant 144 using saw blade or laser cutting tool 252. The cut forms channel 254 extending through substrate 120 to cingulate the semiconductor assembly into semiconductor packages 256. Metal layer 257 can be formed on sidewalls 208 of leads 132 using electroless plating or sputtering, to enhance external electrical connection, similar to FIG. 4b.

Figure 8A:
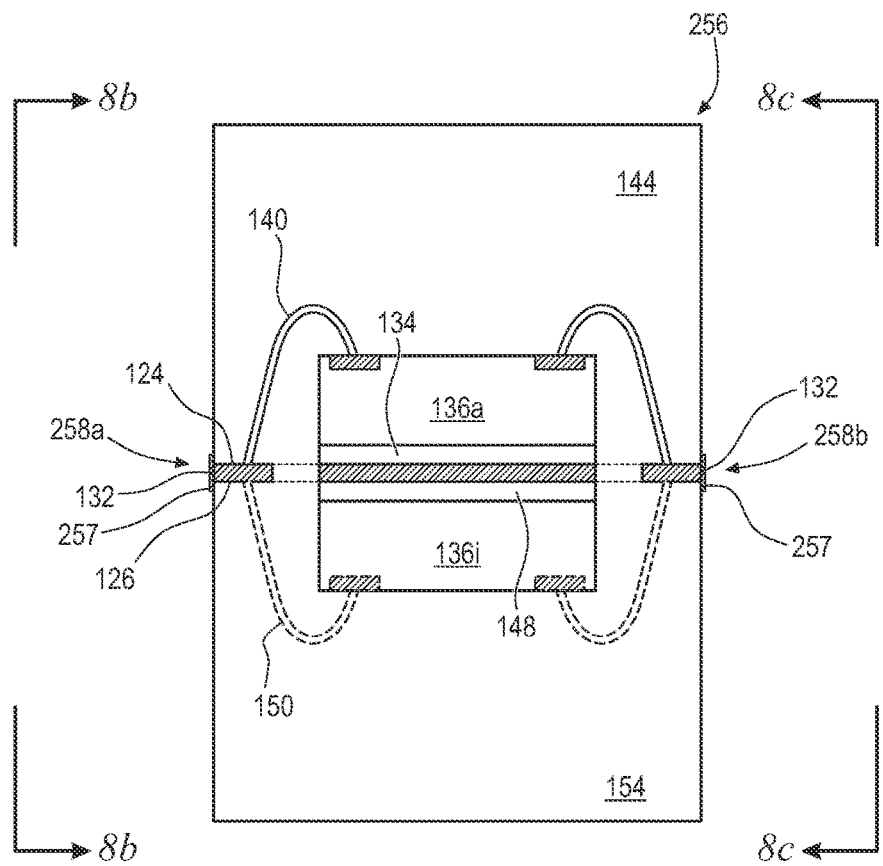
FIGS. 8a-8g illustrate the semiconductor package from FIG. 7d mounted to a PCB.

FIG. 8a shows semiconductor package 256 post singulation. Semiconductor package 256 includes electrical component 136a disposed on surface 124 of substrate 120 over die mounting site 128a, and electrical component 136i disposed on surface 126 of substrate 120 over die mounting site 128i. Accordingly, electrical components 136a and 136i are disposed on opposite sides of substrate 120. Each bond wire 140 electrically connects conductive layer 112 on electrical component 136a to one lead 132, see FIG. 2h. Each bond wire 150 electrically connects conductive layer 112 on electrical component 136i to another lead 132, see FIG. 2m.

Figure 8B:
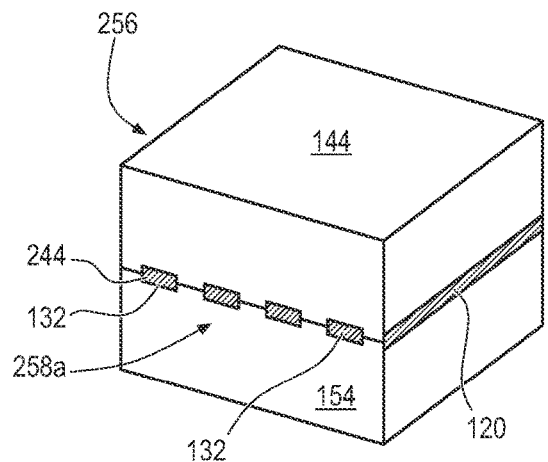
Figure 8C:
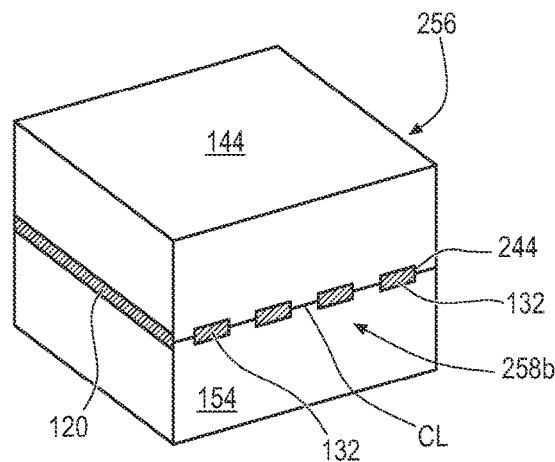

FIG. 8b shows further detail in a perspective view of external connection of lead 132 exposed from encapsulants 144 and 154 in semiconductor package 256, on side 258a of the package relative to FIG. 8a. FIG. 8c shows further detail in a perspective view of external connection of lead 132 exposed from encapsulants 144 and 154 in semiconductor package 256, on a second side 258b opposite the first side 258a of the package relative to FIG. 8a. Leads 132 have a central location CL for external access relative to semiconductor package 256.

Figure 8D:
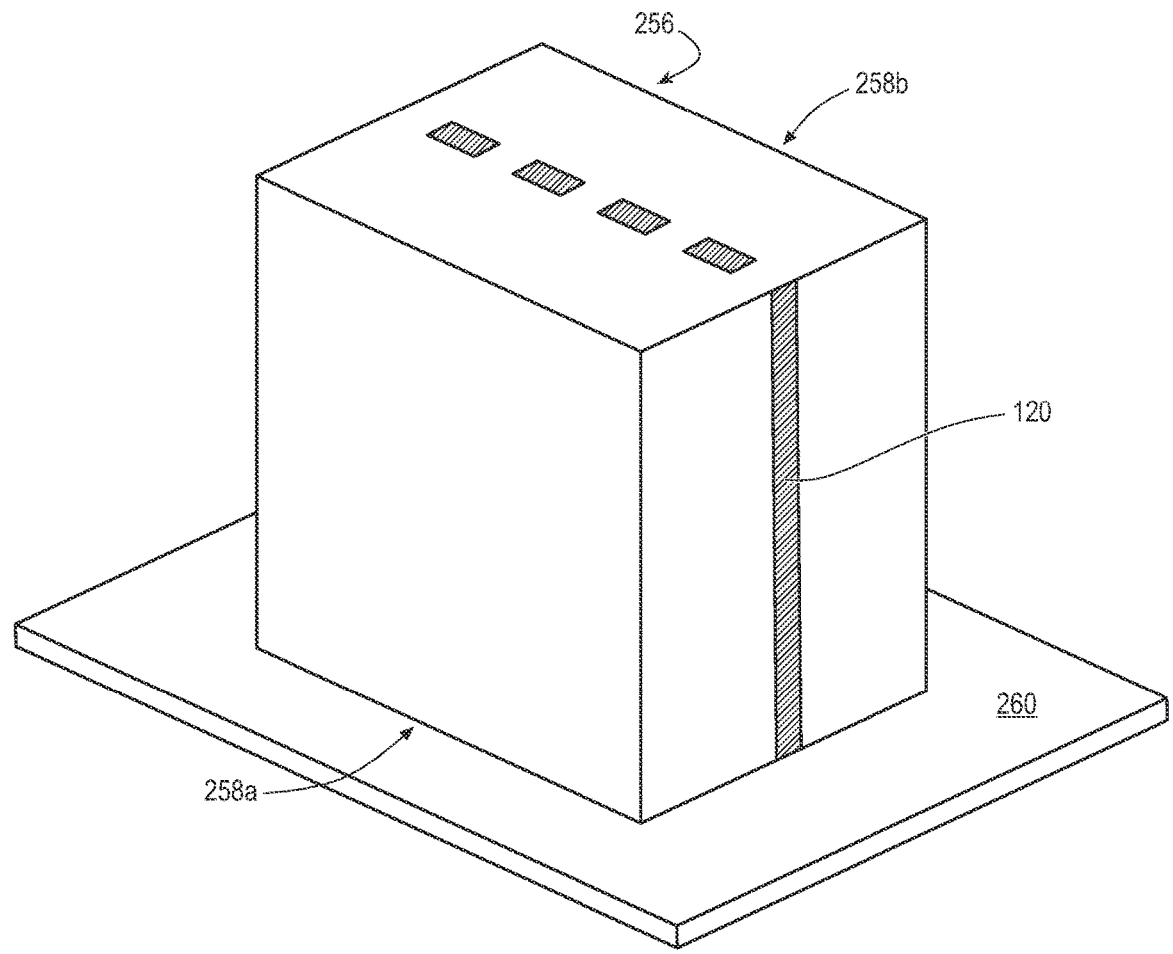

FIG. 8d shows PCB 260 for mounting semiconductor package 256. Semiconductor package 256 is disposed over PCB 260 with side 258a facing down, using a pick and place operation. Semiconductor package 256 in FIG. 8d encloses electrical component 136a on surface 124, and electrical component 136i on surface 126, above PCB 260, similar to FIGS. 5d-5e. Leads 132 on side 258a make electrical and mechanical connection to contacts on PCB 260 leading to other components on the PCB. Alternatively, leads 132 on side 258b may contact PCB 260.

Semiconductor package 256 provides space efficient with package stacking, and high component density per unit area of PCB 260. Semiconductor package 256 can provide more electrical functionality in a smaller footprint on PCB 260. Semiconductor package 256 further provides better product performance and reliability with shorter lead length between electrical components 136 on opposite surfaces of substrate 120, as well as reduced propagation delay and higher speed of operation.

Figures 8E, 8F:
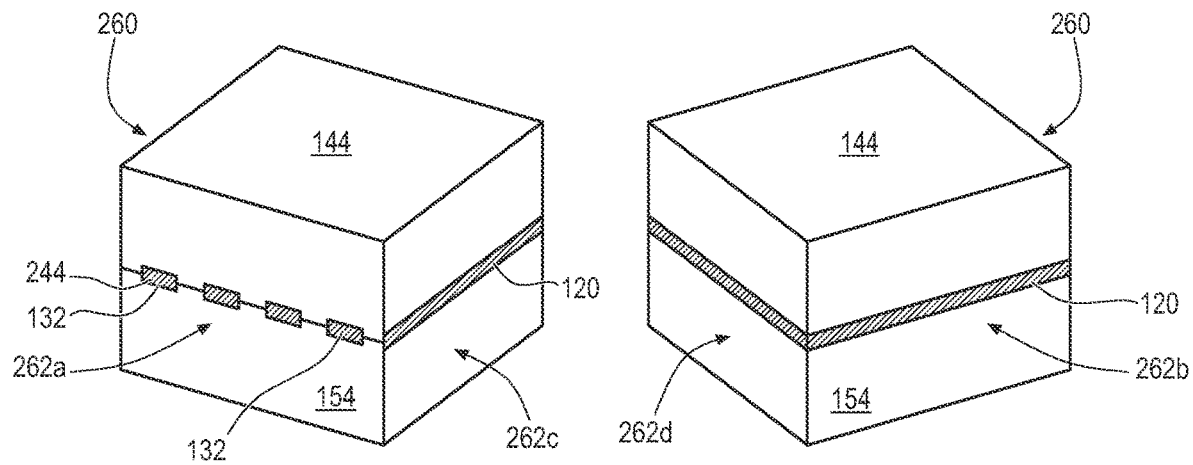

In another embodiment, FIG. 8e shows a perspective view of another semiconductor package 260 post singulation with leads 132 exposed on one side 262a of the semiconductor package. Semiconductor package 260 includes electrical component 136a disposed on surface 124 of substrate 120 over die mounting site 128a, and electrical component 136i disposed on surface 126 of substrate 120 over die mounting site 128i. Accordingly, electrical components 136a and 136i are disposed on opposite sides of substrate 120. Each bond wire 140 electrically connects conductive layer 112 on electrical component 136a to one lead 132, see FIG. 2h. Each bond wire 150 electrically connects conductive layer 112 on electrical component 136i to another lead 132, see FIG. 2m. Side 262c of semiconductor package 260 has no exposed leads 132. FIG. 8f shows a perspective view of sides 262b, opposite side 262a, and side 262d of semiconductor package 260 with no exposed leads 132.

Figure 8G:
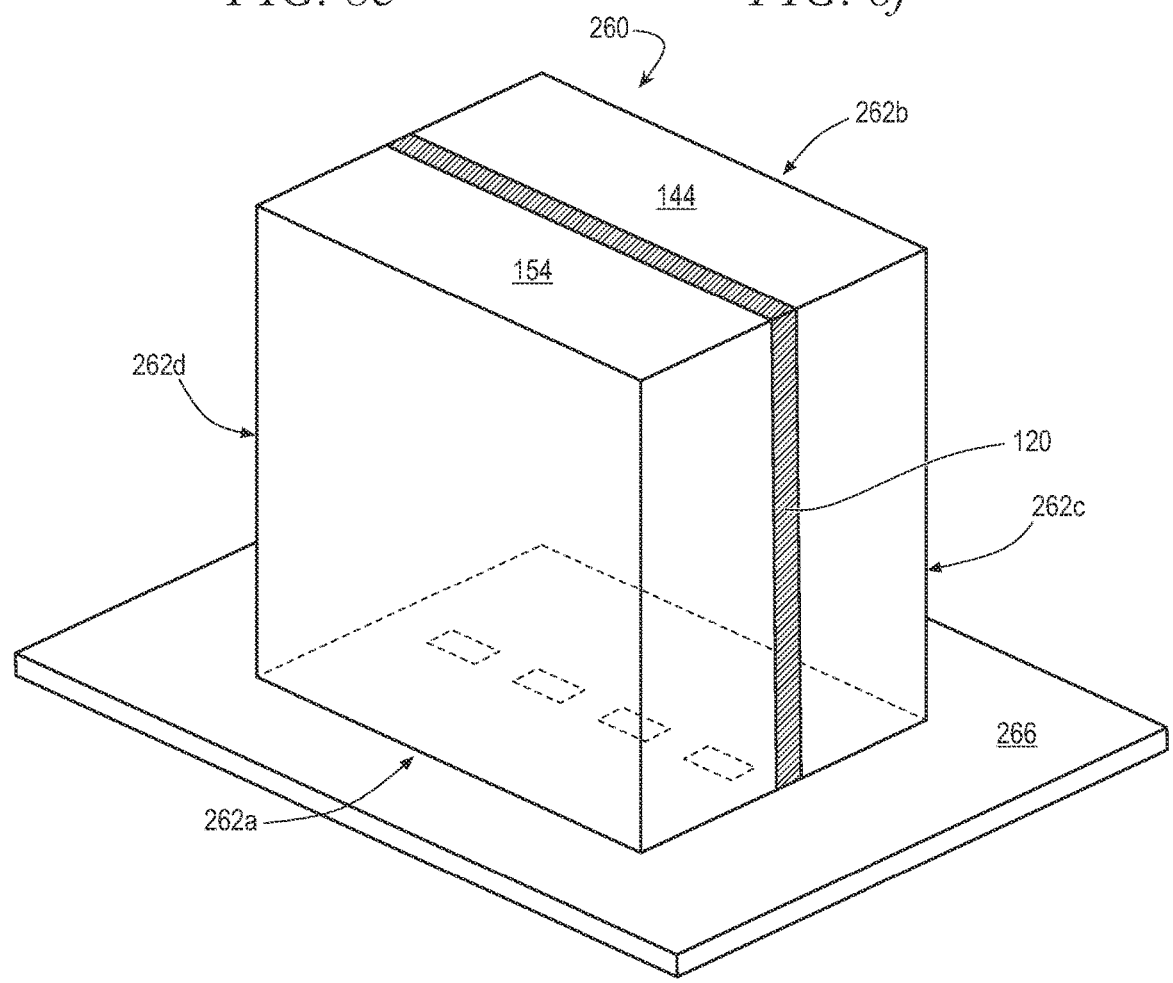

FIG. 8g shows PCB 266 for mounting semiconductor package 256. Semiconductor package 260 is disposed over PCB 266 with side 262a facing down, using a pick and place operation, similar to FIGS. 5d-5e. Semiconductor package 260 in FIG. 8g encloses electrical component 136a on surface 124, and electrical component 136i on surface 126, above PCB 266, similar to FIGS. 2h and 2m. Leads 132 on side 258a make electrical and mechanical connection to contacts on PCB 266 leading to other components on the PCB.

Semiconductor package 260 provides space efficient with package stacking, and high component density per unit area of PCB 266. Semiconductor package 260 can provide more electrical functionality in a smaller footprint on PCB 266. Semiconductor package 260 further provides better product performance and reliability with shorter lead length between electrical components 136 on opposite surfaces of substrate 120, as well as reduced propagation delay and higher speed of operation.

Figure 9A:
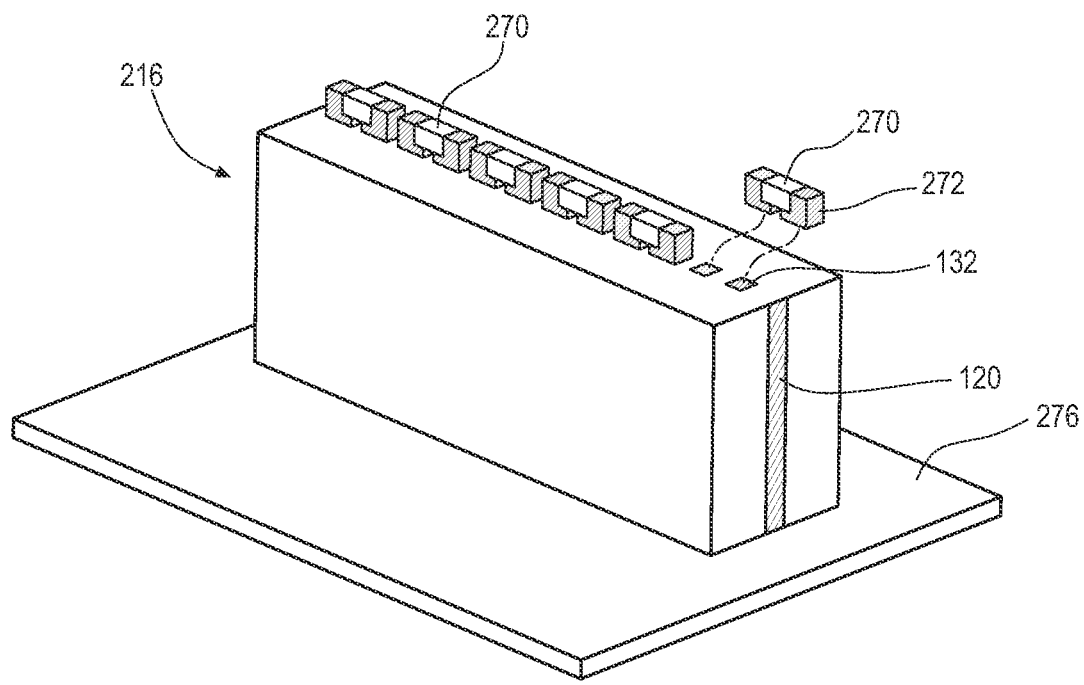
FIGS. 9a-9b illustrate electrical components mounted to the semiconductor package from FIG. 5d.
Figure 9B:
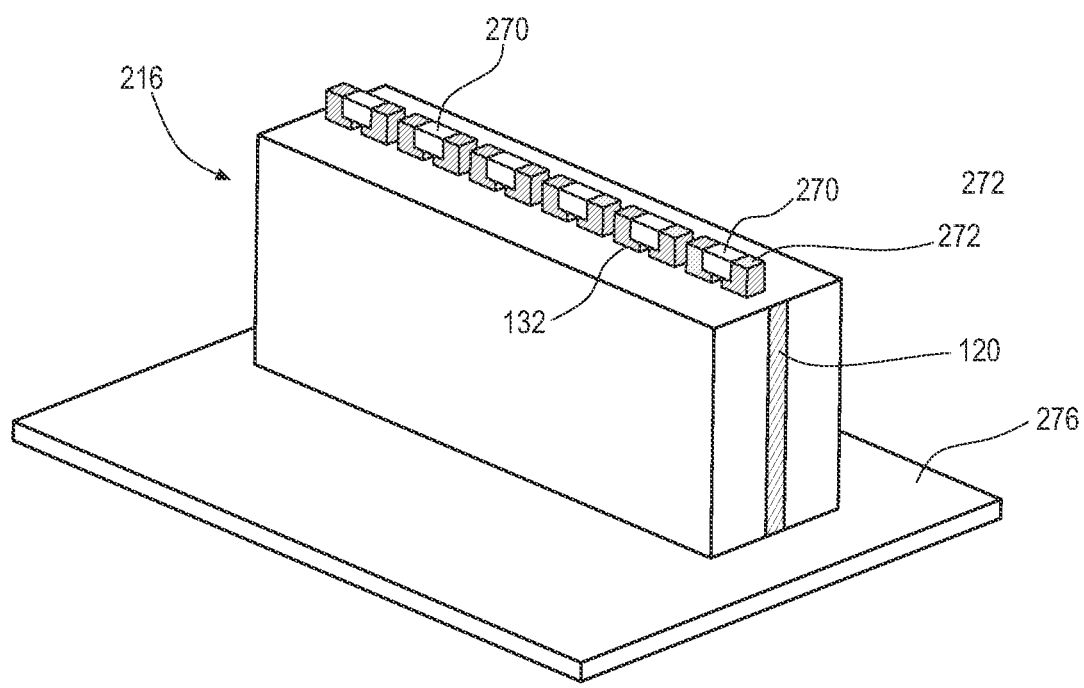

FIG. 9a illustrates electrical component 270 disposed above semiconductor packages 216 from FIG. 5e using a pick and place operation. Semiconductor packages 216 are mounted to PCB 276, similar to FIGS. 5d and 6d. A similar arrangement can be made with semiconductor package 226 from FIG. 6d. Electrical component 270 can be a semiconductor die, semiconductor package, surface mount device, or discrete electrical device, such as a capacitor, resistor, inductor, transistor, diode, or the like. FIG. 9b shows electrical components 270 mounted to semiconductor package 216 with terminals 272 making mechanical and electrical connection to leads 132 of the semiconductor package.

Figure 10A:
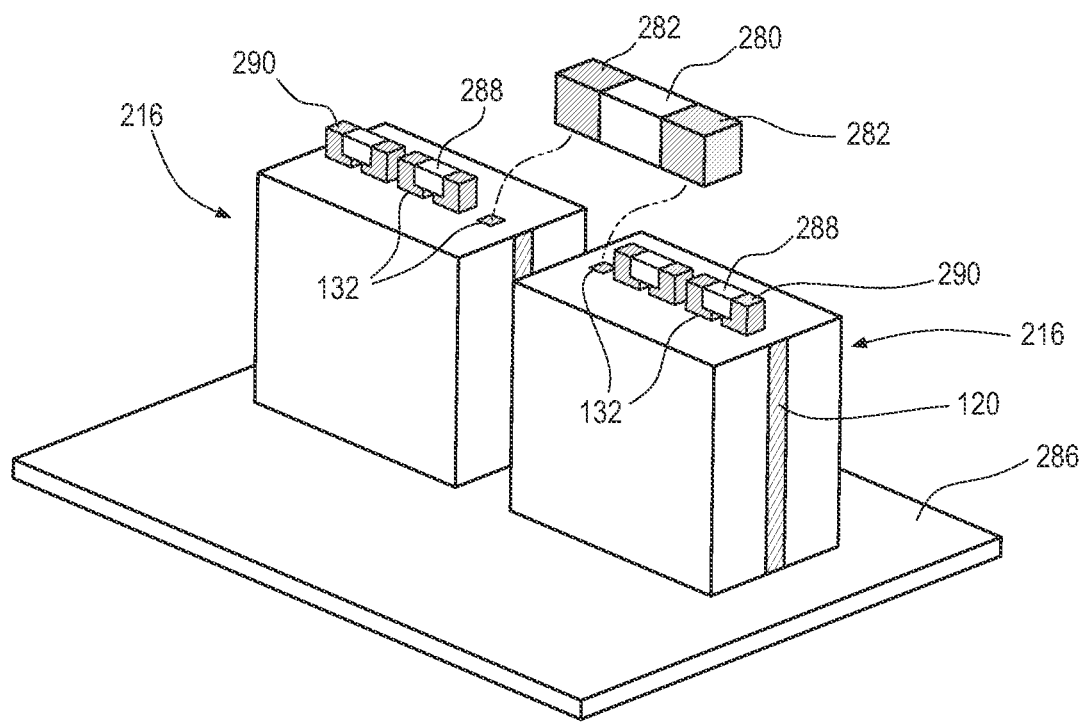
FIGS. 10a-10b illustrate another embodiment of electrical components mounted to the semiconductor package from FIG. 5d.
Figure 10B:
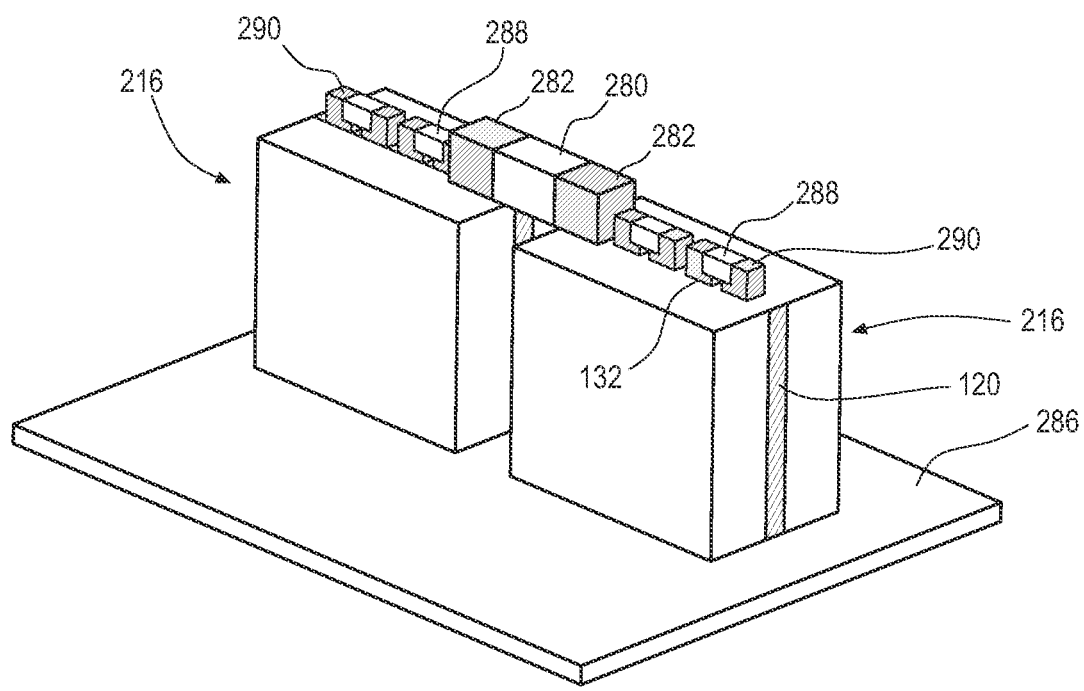

FIG. 10a illustrates electrical component 280 disposed above semiconductor packages 216 from FIG. 5e using a pick and place operation. Semiconductor package 216 is mounted to PCB 286, similar to FIGS. 5d-5e. A similar arrangement can be made with semiconductor package 226 from FIG. 6d. In particular, electrical component 280 is disposed across adjacent semiconductor packages 216. Electrical component 280 can be a semiconductor die, semiconductor package, surface mount device, or discrete electrical device, such as a capacitor, resistor, inductor, transistor, diode, or the like. FIG. 10b shows electrical components 280 mounted to adjacent semiconductor package 216 with terminals 282 making mechanical and electrical connection to leads 132 of the semiconductor packages. Electrical components 286 are also mounted to semiconductor packages 216 with terminals 288 making mechanical and electrical connection to leads 132 of the semiconductor package.

Figure 11A:
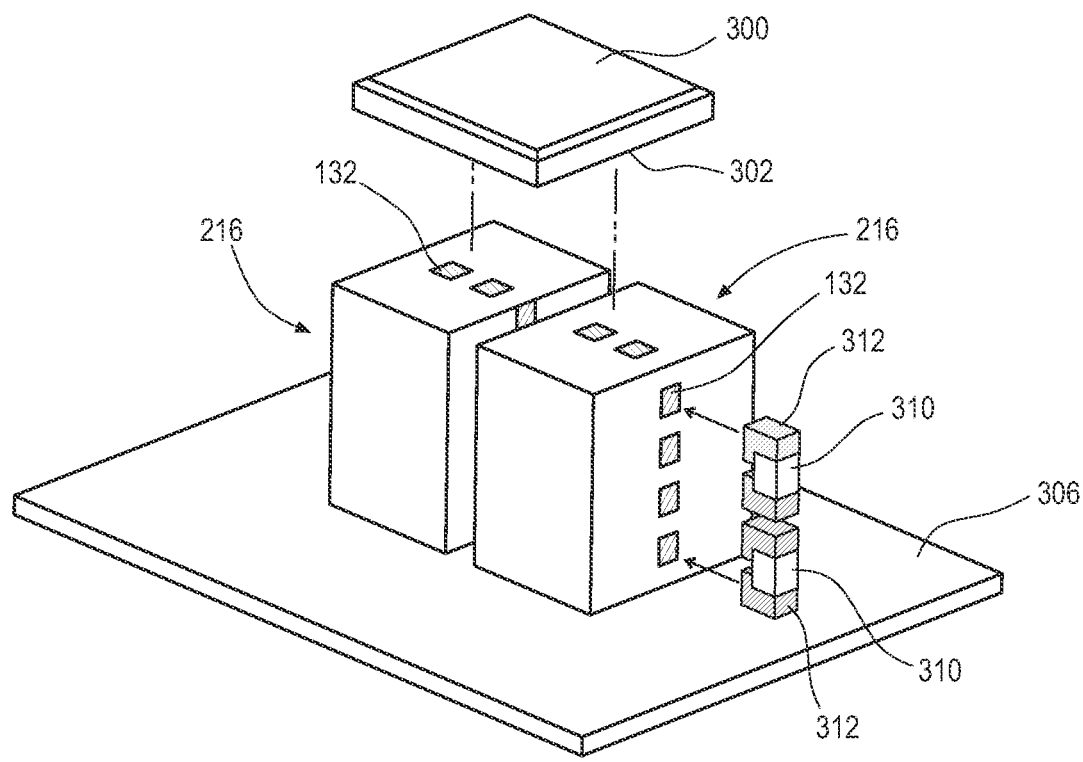
FIGS. 11a-11b illustrate electrical components mounted to the semiconductor package from FIG. 6d.
Figure 11B:
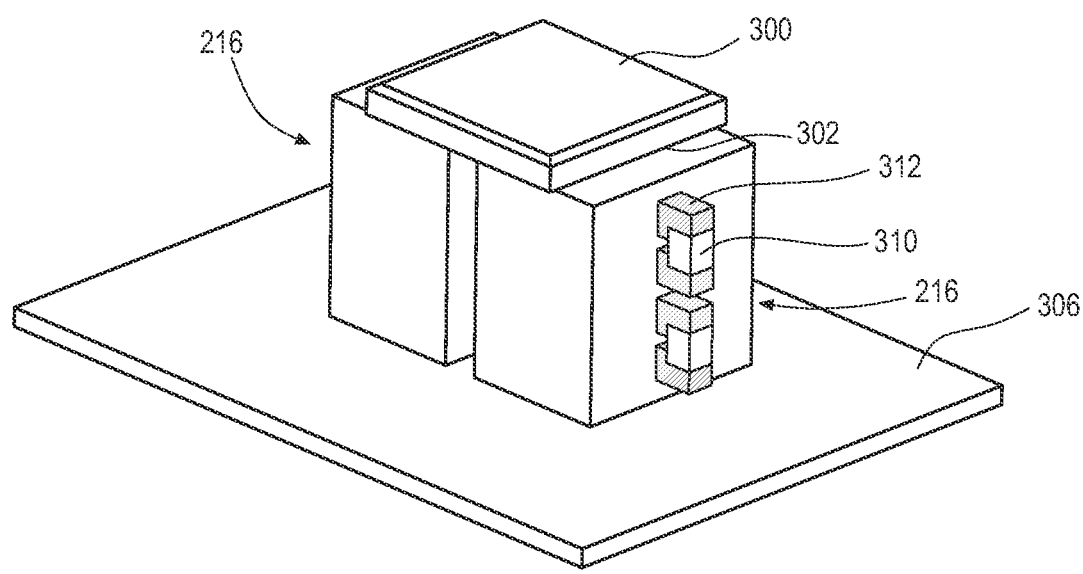

FIG. 11a illustrates electrical component 300 disposed above semiconductor packages 216 from FIG. 5e using a pick and place operation. Semiconductor package 216 is mounted to PCB 306, similar to FIGS. 5d-5e. A similar arrangement can be made with semiconductor package 226 from FIG. 6d. In particular, electrical component 300 is disposed across adjacent semiconductor packages 216. Electrical component 300 can be a semiconductor die, semiconductor package, surface mount device, or discrete electrical device, such as a capacitor, resistor, inductor, transistor, diode, or the like. FIG. 11b shows electrical components 300 mounted to adjacent semiconductor package 216 with terminals 302 making mechanical and electrical connection to leads 132 of the semiconductor packages. Electrical components 310 are also mounted to semiconductor packages 216 with terminals 312 making mechanical and electrical connection to leads 132 of the semiconductor package.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor device, comprising:
a substrate including a die mounting site and a plurality of leads;
a first electrical component disposed over a first surface of the die mounting site;
a second electrical component disposed over a second surface of the die mounting site opposite the first surface of the die mounting site; and
an encapsulant deposited over the first electrical component and the second electrical component with a channel formed in all sides of the encapsulant proximate to the second electrical component and completely around the second electrical component and extending to a center location of the substrate and further extending partially but not completely through the plurality of leads to form a notch in the plurality of leads at the center location of the substrate while leaving the encapsulant proximate to the first electrical component to be wider than the encapsulant proximate to the second electrical component.

2. The semiconductor device of claim 1, further including:
a first bond wire coupled between the first electrical component and a first lead of the plurality of leads; and
a second bond wire coupled between the second electrical component and a second lead of the plurality of leads.

3. The semiconductor device of claim 1, wherein the encapsulant includes:
a first encapsulant deposited over the first electrical component; and
a second encapsulant deposited over the second electrical component with the leads exposed between the first encapsulant and second encapsulant.

4. The semiconductor device of claim 3, wherein the leads are exposed from the first encapsulant and second encapsulant on a side of the semiconductor device.

5. The semiconductor device of claim 3, wherein an area of a surface of the first encapsulant is greater than an area of a surface of the second encapsulant opposite the surface of the first encapsulant.

6. A semiconductor device, comprising:
a substrate including a die mounting site and a plurality of leads;
a first electrical component disposed over a first surface of the die mounting site;
a second electrical component disposed over a second surface of the die mounting site opposite the first surface of the die mounting site; and
an encapsulant deposited over the first electrical component and the second electrical component with an area of a first surface of the encapsulant proximate to the first electrical component being greater than an area of a second surface of the encapsulant proximate to the second electrical component and opposite the first surface of the encapsulant and a notch formed in the plurality of leads at a center location of the substrate.

7. The semiconductor device of claim 6, further including:
a first bond wire coupled between the first electrical component and a first lead on the substrate; and
a second bond wire coupled between the second electrical component and a second lead on the substrate.

8. The semiconductor device of claim 7, further including a third electrical component disposed over the first lead and second lead on the substrate.

9. The semiconductor device of claim 7, further including a metal layer formed over the first lead on the substrate.

10. The semiconductor device of claim 7, wherein the encapsulant includes:
a first encapsulant deposited over the first electrical component; and
a second encapsulant deposited over the second electrical component.

11. The semiconductor device of claim 10, wherein an area of a surface of the first encapsulant is greater than an area of a surface of the second encapsulant opposite the surface of the first encapsulant.

12. The semiconductor device of claim 6, further including a printed circuit board, wherein the semiconductor device is disposed in an opening through the printed circuit board with the encapsulant proximate to the second electrical component disposed through the opening to extend beyond a first surface of the printed circuit board as the area of the second surface of the encapsulant is less than an area of the opening while the encapsulant proximate to the first electrical component remains above a second surface of the printed circuit board opposite the first surface of the printed circuit board as the area of the first surface of the encapsulant is greater than the area of the opening.

13. The semiconductor device of claim 6, wherein a first surface area of the encapsulant proximate to the first electrical component is wider than a second surface area of the encapsulant proximate to the second electrical component opposite the first surface area of the encapsulant.

14. A semiconductor device, comprising:
a substrate including a die mounting site and a plurality of leads;

a first electrical component disposed over a first surface of the die mounting site;

a second electrical component disposed over a second surface of the die mounting site opposite the first electrical component; and an encapsulant deposited over the first electrical component and the second electrical component with the encapsulant proximate to the first electrical component being wider than the encapsulant proximate to the second electrical component and a notch formed in the plurality of leads proximate to a center location of the substrate.

15. The semiconductor device of claim 14, further including:

a first bond wire coupled between the first electrical component and a first lead on the substrate; and a second bond wire coupled between the second electrical component and a second lead on the substrate.

16. The semiconductor device of claim 15, further including a third electrical component disposed over the first lead and second lead on the substrate.

17. The semiconductor device of claim 15, further including a metal layer formed over the first lead on the substrate.

18. The semiconductor device of claim 14, wherein an area of a surface of the encapsulant deposited over the first electrical component is greater than an area of a surface of the encapsulant deposited over the second electrical component.

19. The semiconductor device of claim 14, further including a printed circuit board, wherein the semiconductor device is disposed in an opening through the printed circuit board with the encapsulant proximate to the second electrical component disposed through the opening to extend beyond a first surface of the printed circuit board while the encapsulant proximate to the first electrical component remains above a second surface of the printed circuit board opposite the first surface of the printed circuit board.

20. The semiconductor device of claim 14, wherein a first surface area of the encapsulant proximate to the first electrical component is wider than a second surface area of the encapsulant proximate to the second electrical component opposite the first surface area of the encapsulant.

* * * * *

UNITED STATES PATENT AND TRADEMARK OFFICE
CERTIFICATE OF CORRECTION

PATENT NO. : 12,489,078 B2  
APPLICATION NO. : 17/656508  
DATED : December 2, 2025  
INVENTOR(S) : Krit Pajuvang et al.

Page 1 of 1

It is certified that error appears in the above-identified patent and that said Letters Patent is hereby corrected as shown below:

In the Claims

Column 12, Claim 10, Line 38, replace the number "7" with the number --6--.

Signed and Sealed this  
Thirteenth Day of January, 2026

John A. Squires  
*Director of the United States Patent and Trademark Office*